US012622002B2

(12) United States Patent
Park et al.

(10) Patent No.: US 12,622,002 B2
(45) Date of Patent: May 5, 2026

(54) SEMICONDUCTOR DEVICE INCLUDING MEMORY CELL INCLUDING THYRISTOR AND METHOD OF MANUFACTURING THE SAME

(71) Applicant: SK hynix Inc., Icheon-si (KR)

(72) Inventors: Bo Min Park, Icheon-si (KR); Seung Wook Ryu, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 493 days.

(21) Appl. No.: 18/356,162

(22) Filed: Jul. 20, 2023

(65) Prior Publication Data

US 2024/0276741 A1 Aug. 15, 2024

(30) Foreign Application Priority Data

Feb. 15, 2023 (KR) ........................ 10-2023-0020360

(51) Int. Cl.
*H10B 99/00* (2023.01)
*H10B 12/10* (2023.01)
*H10D 84/00* (2025.01)

(52) U.S. Cl.
CPC ............. *H10B 99/20* (2023.02); *H10B 12/10* (2023.02); *H10D 84/131* (2025.01)

(58) Field of Classification Search
CPC ....... H10B 99/20; H10B 12/10; H10D 84/131
See application file for complete search history.

(56) References Cited

U.S. PATENT DOCUMENTS

| 2011/0215371 A1* | 9/2011 | Tang | H10D 18/01 |
| | | | 257/E21.388 |
| 2020/0075466 A1 | 3/2020 | Chen et al. | |
| 2021/0233912 A1* | 7/2021 | Luan | H10D 88/01 |

* cited by examiner

*Primary Examiner* — Benjamin Tzu-Hung Liu

(57) ABSTRACT

A semiconductor device according to an embodiment includes a substrate, first and second pillar electrodes extending along a vertical direction substantially perpendicular to a surface of the substrate, and a plurality of memory cells disposed between the first and second pillar electrodes. Each of the plurality of memory cells includes first and second shared device layers that are disposed adjacent to the first and second pillar electrodes, respectively, and extend along the vertical direction, first and second base device layers disposed between the first and second shared device layers, and a control gate electrode disposed on one of the first and second base device layers. Both first and second base device layers are disposed on a plane over the substrate and substantially parallel to the surface of the substrate.

17 Claims, 40 Drawing Sheets

1061

A — — — — — — — — — — — — — — — — — — — — A'

SEMICONDUCTOR DEVICE INCLUDING MEMORY CELL INCLUDING THYRISTOR AND METHOD OF MANUFACTURING THE SAME

CROSS-REFERENCE TO RELATED APPLICATIONS

The present application claims priority under 35 U.S.C. § 119(a) to Korean Application No. 10-2023-0020360, filed in the Korean Intellectual Property Office on Feb. 15, 2023, which is incorporated herein by reference in its entirety.

BACKGROUND

1. Technical Field

The present disclosure generally relates to a semiconductor device and, more particularly, to a semiconductor device including a memory cell with a thyristor and a method of manufacturing the same.

2. Related Art

With the trend of requiring high-density, high-speed, and low-power operation, the size of DRAM cell is continuously decreasing. As the size of the DRAM cell decreases, it becomes increasingly difficult to secure a cell capacitance required to identify a signal stored in the DRAM cell.

Recently, research on a capacitor-less 1T DRAM device has been actively conducted as a move away from a memory device having the conventional one transistor-one capacitor (1T-1C) structure. As an example of the capacitor-less 1T DRAM device, a thyristor memory device (referred to as "thyristor") has been proposed. In a thyristor, an electrical conduction state and an electrical blocking state implemented using turn-on and turn-off operations of the thyristor may be stored as different signal information.

SUMMARY

A semiconductor device according to an embodiment of the present disclosure may include a substrate, first and second pillar electrodes extending along a vertical direction substantially perpendicular to a surface of the substrate, and a plurality of memory cells disposed between the first and second pillar electrodes. Each of the plurality of memory cells may include first and second shared device layers that are disposed adjacent to the first and second pillar electrodes, respectively, and extend along the vertical direction, first and second base device layers disposed between the first and second shared device layers, both first and second base device layers disposed on a plane over the substrate and substantially parallel to the surface of the substrate, and a control gate electrode disposed on one of the first and second base device layers.

A semiconductor device according to another embodiment of the present disclosure may include a substrate, first and second pillar electrodes extending along a vertical direction substantially perpendicular to a surface of the substrate, and a plurality of memory cells disposed between the first and second pillar electrodes and disposed along the vertical direction. Each of the plurality of memory cells may include a first shared device layer including a p-type metal oxide semiconductor material and extending along the vertical direction, a first base device layer disposed over the substrate to contact the first shared device layer on a plane substantially parallel to the surface of the substrate, a second base device layer disposed to contact the first base device layer on the plane, a second shared device layer that extends in the vertical direction and contacts the second base device layer, and a control gate electrode disposed on the second base device layer. The first base device layer includes an n-type metal oxide semiconductor material, the second base device layer includes a p-type metal oxide semiconductor material, and the second shared device layer includes an n-type metal oxide semiconductor material.

BRIEF DESCRIPTION OF THE DRAWINGS

FIGS. 7A to 20A are schematic plan views illustrating a method of manufacturing a semiconductor device according to an embodiment of the present disclosure.

FIGS. 7B to 20B are cross-sectional views of structures shown in FIGS. 7A to 20A taken along a line A-A' and shown on an x-y plane.

DETAILED DESCRIPTION

Figure 1:
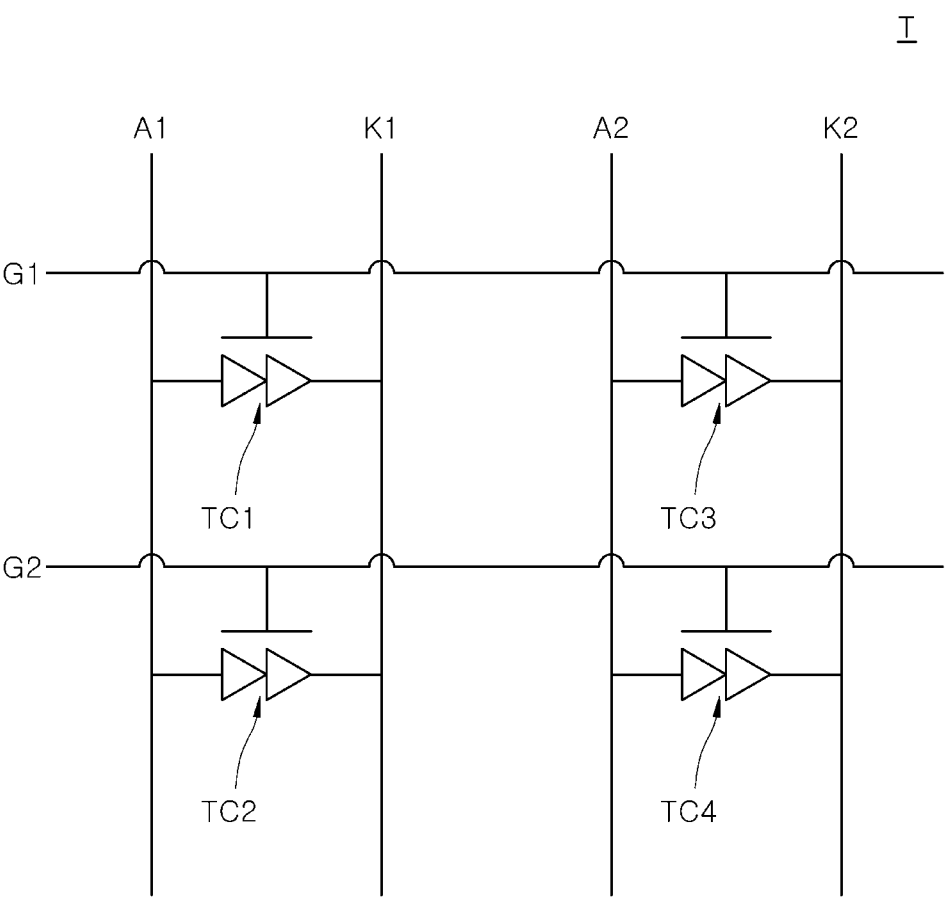
FIG. 1 is a schematic circuit diagram illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Terms used in the specification of the present application are terms selected in consideration of functions in the presented embodiments, and the meaning of the terms may vary depending on the intention or custom of a user or operator in the technical field. The meanings of the terms used follow the definitions defined when specifically defined herein, and may be interpreted as meanings generally recognized by those skilled in the art in the absence of specific definitions. In the description of examples of the present application, descriptions such as "first" and "second" are for distinguishing members, and are not used to limit the members themselves or to mean a specific order.

Embodiments of the present disclosure may be described through drawings using an x-y-z coordinate system. The x-direction referred to in this specification may mean a direction parallel to the x-axis. Similarly, the y-direction and the z-direction may refer to directions parallel to the y-axis and z-axis, respectively.

A semiconductor device according to an embodiment of the present disclosure may include a memory cell including a thyristor. It is possible to write signal information that is identified with each other by applying an external voltage to the memory cell to control an electrical conduction state and an electrical blocking state of the thyristor. In addition, the written signal information may be read out using a property in which a voltage level of a bit line connected to the thyristor changes according to the electrical conduction state and the electrical blocking state of the thyristor.

Figure 2:
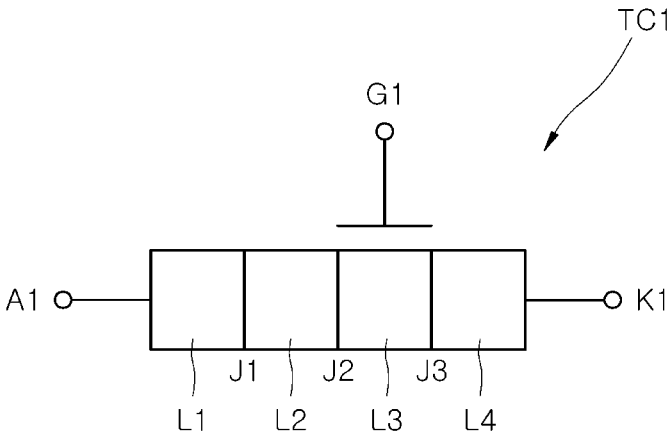
FIG. 2 is a schematic view illustrating a memory cell of a semiconductor device according to an embodiment of the present disclosure.

FIG. 1 is a schematic circuit diagram illustrating a semiconductor device according to an embodiment of the present disclosure. FIG. 2 is a schematic view illustrating a memory cell of a semiconductor device according to an embodiment of the present disclosure.

Referring to FIG. 1, a semiconductor device T may include first to fourth memory cells TC1, TC2, TC3, and TC4. The first to fourth memory cells TC1, TC2, TC3, and TC4 may include substantially the same configuration as each other. As shown in FIG. 1, the first memory cell TC1 may be connected to a first anode line A1, a first cathode line 1 K1, and a first control gate line G1. The second memory cell TC2 may be connected to the first anode line A1, the first cathode line K1, and a second control gate line G2. The third memory cell TC3 may be connected to a second anode line A2, a second cathode line K2, and the first control gate line G1. The fourth memory cell TC4 may be connected to the second anode line A2, the second cathode line K2, and the second control gate line G2. Hereinafter, a configuration of the memory cell will be described in more detail using the first memory cell TC1 in FIG. 2.

Referring to FIG. 2, the first memory cell TC1 may include a first p-type device layer L1, a first n-type device layer L2, a second p-type device layer L3, and a second n-type device layer L4. The first memory cell TC1 may include a thyristor including a PNPN diode junction. The first p-type device layer L1 may be connected to the first anode line A1, and the second n-type device layer L4 may be connected to the first cathode line K1. The second p-type device layer L3 may be electrically controlled by the first control gate line G1.

Each of the first p-type device layer L1 and the second p-type device layer L3 may include a p-type material having a hole as a carrier. A hole concentration of the first p-type device layer L1 may be higher than a hole concentration of the second p-type device layer L3. As an example, the hole concentration of the first p-type device layer L1 may be $1 \times 10^{20}$ cm$^{-3}$ or higher, and the hole concentration of the second p-type device layer L3 may be $1 \times 10^{15}$ cm$^{-3}$ to $1 \times 10^{18}$ cm$^{-3}$. Each of the first n-type device layer L2 and the second n-type device layer L4 may include an n-type material having an electron as a carrier. An electron concentration of the second n-type device layer L4 may be higher than an electron concentration of the first n-type device layer L2. As an example, the electron concentration of the second n-type device layer L4 may be $1 \times 10^{20}$ cm$^{-3}$ or higher, and the electron concentration of the first n-type device layer L2 may be $1 \times 10^{15}$ cm$^{-3}$ to $1 \times 10^{18}$ cm$^{-3}$. Hereinafter, a device layer including the holes or the electrons at a high concentration of $1 \times 10^{20}$ cm$^{-3}$ or higher is referred to as a "high-concentration carrier layer".

Referring to FIG. 2, the first p-type device layer L1 and the first n-type device layer L2 may form a first p-n junction J1, the first n-type device layer L2 and the second p-type device layer L3 may form a second p-n junction, and the second p-type device layer L3 and the second n-type device layer L4 may form a third p-n junction J3.

Hereinafter, write and read operations for the first memory cell TC1 according to an embodiment will be schematically described using FIGS. 1 and 2. In a standby state, the same preliminary voltage having a positive polarity may be applied to the first anode line A1 and the first cathode line K1, and a preliminary gate voltage having a negative polarity may be applied to the first control gate line G1.

Writing of signal "1" to the first memory cell TC1 may proceed as follows. A first write voltage having a positive polarity and higher than the preliminary voltage may be applied to the first anode line A1, and a ground voltage may be applied to the first cathode line K1. Accordingly, the first p-n junction J1 and the third p-n junction J3 may be forward biased, and the second p-n junction J2 may be reverse biased. In this case, holes may be supplied to the second p-type device layer L3 by applying a first pulse gate voltage having a positive polarity to the first control gate line G1. The reverse biased second p-n junction J2 may be converted into the forward biased state by the supplied holes so that the thyristor of the first memory cell TC1 may be turned on. Subsequently, the thyristor may be converted to the standby state and maintain the turned-on state, that is, the electrical conduction state, thereby writing the signal "1".

In addition, writing of signal "0" to the first memory cell TC1 may proceed as follows. A second write voltage having a positive polarity and lower than the preliminary voltage may be applied to the first anode line A1, and the ground voltage may be applied to the first cathode line K1. In addition, the first pulse gate voltage having a positive polarity may be applied to the first control gate line G1. By the application of the second write voltage, the thyristor of the first memory cell TC1 may be turned off or maintained in a turned off state. For example, when the first memory cell TC1 stores the signal "1", which is in an electrical conduction state, a voltage difference between the first anode line A1 and the first cathode line K1 may be reduced below a threshold value by the application of the second write voltage. Accordingly, the current flowing between the first anode line A1 and the first cathode line K1 decreases, and the thyristor may be converted from an electrical conduction state to an electrical blocking state. Subsequently, the thyristor may be converted into the standby state, and maintain the electrical blocking state, thereby writing the signal "0".

A read operation for the first memory cell TC1 may proceed as follows. A predetermined reference voltage may be applied to the first anode line A1 to pre-charge the first anode line A1, and a ground voltage may be applied to the first cathode line K1. In an embodiment, the reference voltage may be the same as the first write voltage. In addition, a second pulse gate voltage having a positive polarity and lower than the first pulse gate voltage may be applied to the first control gate line G1. When the first memory cell TC1 stores the signal "1", the thyristor may maintain an electrical conduction state. Accordingly, the voltage level of the first anode line A1 may decrease from the reference voltage. In addition, when the first memory cell TC1 stores the signal "0", the thyristor may maintain an electrical blocking state. Accordingly, the voltage level of the first anode line A1 may maintain the reference voltage. As described above, the read operation for the first memory cell TC1 may be performed by reading the change in the reference voltage according to the stored signal of the first memory cell TC1.

The operations of the first memory cell TC1 described with reference to FIG. 2 may be applied to the operations of the second to fourth memory cells TC2, TC3, and TC4 of FIG. 1 in substantially the same manner. Meanwhile, the first to fourth memory cells TC1, TC2, TC3, and TC4 may be independently driven. Accordingly, the first to fourth memory cells TC1, TC2, TC3, and TC4 may constitute a random access memory (RAM) device.

According to an embodiment of the present disclosure, in connection with FIG. 1, four memory cells TC1, TC2, TC3, and TC4 consisting of two anode lines A1 and A2, two cathode lines K1 and K2, and two control gate lines G1 and G2 have been described, but the technical ideas of the present disclosure are not necessarily limited thereto. For example, according to other embodiments of the present disclosure, a semiconductor device may include a plurality of memory cells including different numbers of anode lines, cathode lines, and control gate lines.

The memory cells including the above-described thyristors may be effectively integrated in three dimensions. Hereinafter, a semiconductor device including the three-dimensionally integrated memory cells according to an embodiment of the present disclosure will be described in more detail.

Figure 3:
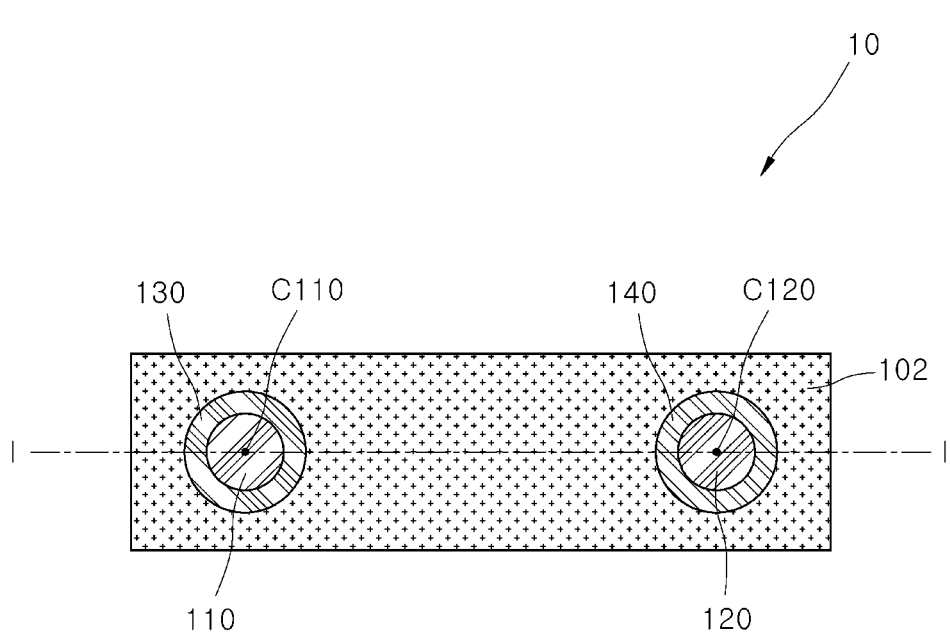
FIG. 3 is a schematic plan view illustrating a semiconductor device according to an embodiment of the present disclosure.
Figure 3:
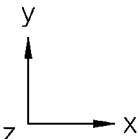
Figure 4:
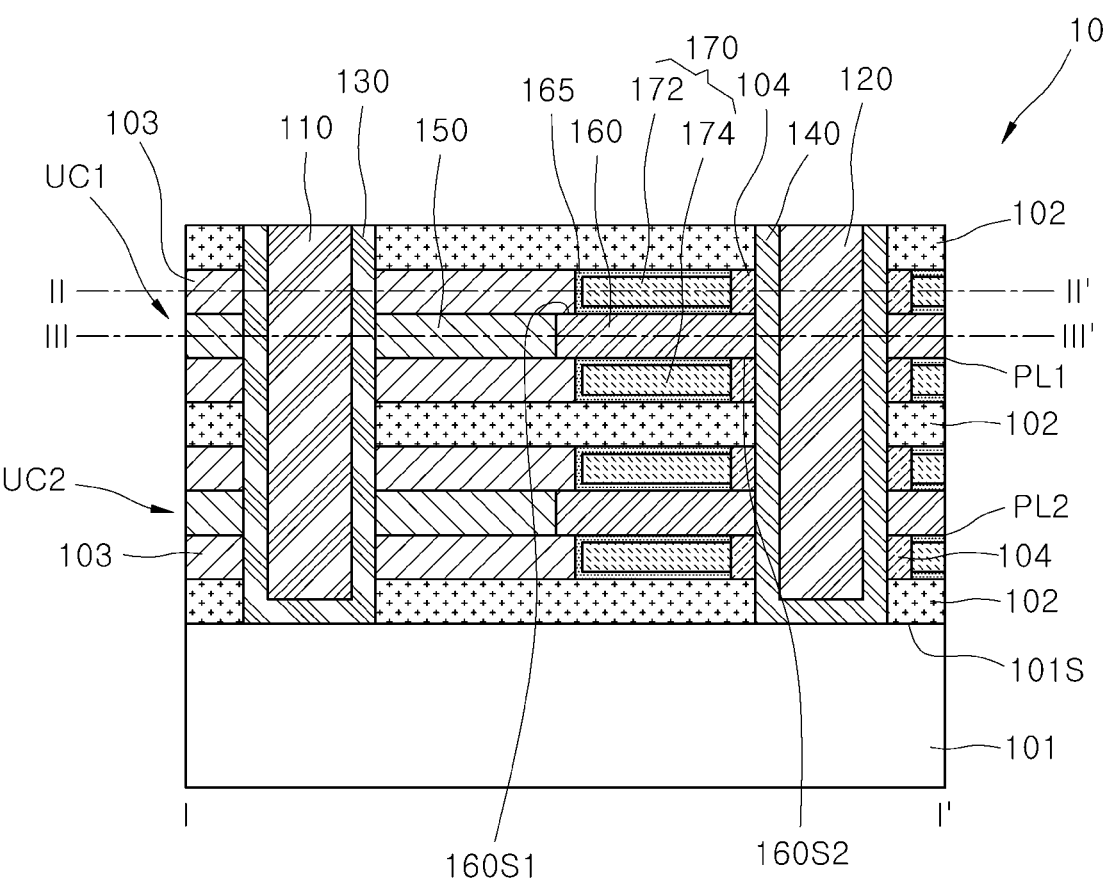
FIG. 4 is a cross-sectional view of a semiconductor device of FIG. 3 taken along a line I-I'.
Figure 4:
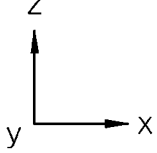
Figure 5:
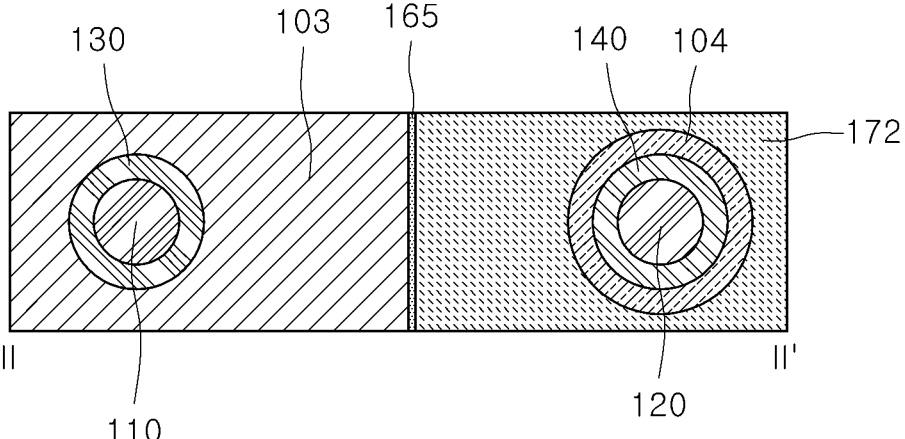
FIG. 5 is a cross-sectional view of a semiconductor device of FIG. 4 taken along a line II-II' and shown on an x-y plane.
Figure 5:
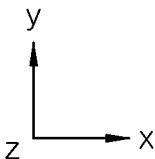
Figure 6:
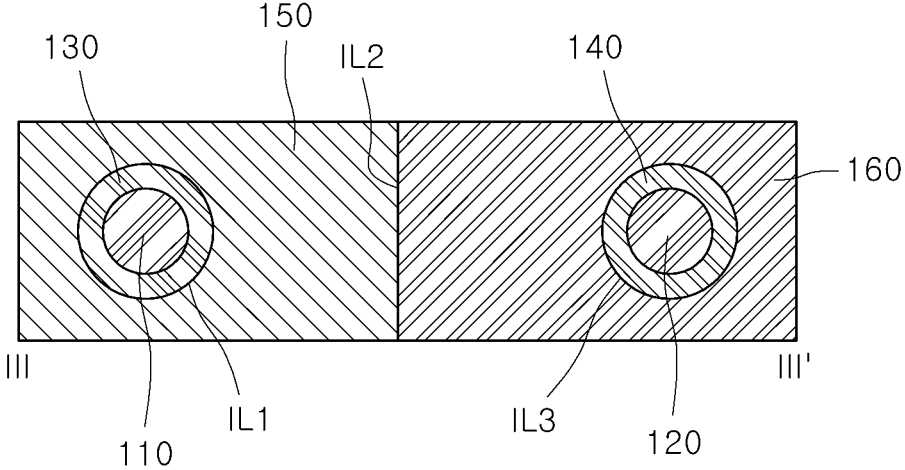
FIG. 6 is a cross-sectional view of a semiconductor device of FIG. 4 taken along a line III-III' and shown on an x-y plane.
Figure 6:
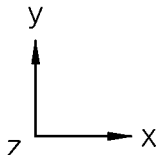

FIG. 3 is a schematic plan view illustrating a semiconductor device according to an embodiment of the present disclosure. FIG. 4 is a cross-sectional view of a semiconductor device of FIG. 3 taken along a line I-I'. FIG. 5 is a cross-sectional view of a semiconductor device of FIG. 4 taken along line II-II' and shown on an x-y plane. FIG. 6 is a cross-sectional view of a semiconductor device of FIG. 4 taken along a line III-III' and shown on an x-y plane.

Referring to FIGS. 3 to 6, a semiconductor device 10 may include a substrate 101, first and second pillar electrodes 110 and 120 disposed on the substrate 101 to be spaced apart from each other, and first and second unit cells UC1 and UC2 disposed between the first and second pillar electrodes 110 and 120. Each of the first and second unit cells UC1 and UC2 may include first and second shared device layers 130 and 140 disposed adjacent to the first and second pillar electrodes 110 and 120, respectively; first and second base device layers 150 and 160, disposed on the same plane over and substantially parallel to the substrate 101, between the first and second shared device layers 130 and 140; and a control gate electrode 170 disposed on one of the first and second base device layers 150 and 160. FIG. 4 illustrates a cross-section of the semiconductor device 10 taken along the line I-I' crossing a center C110 of the first pillar electrode 110 and a center C120 of the second pillar electrode 120.

The first and second unit cells UC1 and UC2 may correspond to the first and second memory cells TC1 and TC2, respectively, in the circuit diagram of FIG. 1. Accordingly, each of the first and second unit cells UC1 and UC2 may include a thyristor having a PNPN diode junction. In an embodiment, the first pillar electrode 110 and the second pillar electrode 120 may correspond to the first anode line A1 and the first cathode line K1 of FIG. 1, respectively. The control gate electrodes 170 of the first and second unit cells UC1 and UC2 may correspond to the first and second control gate line G1 and G2 of FIG. 1.

Each of the first and second unit cells UC1 and UC2 may include the first shared device layer 130, the first base device layer 150, the second base device layer 160, and the second shared device layer 140. The first shared device layer 130, the first base device layer 150, the second base device layer 160, and the second shared device layer 140 may correspond to the first p-type device layer L1, the first n-type device layer L2, the second p-type device layer L3, and the second n-type device layer L4 of FIG. 2, respectively. In addition, the control gate electrode 170 may be disposed adjacent to the second base device layer 160. The control gate electrode 170 may include an upper electrode part 172 disposed on an upper surface 160S1 of the second base device layer 160 and a lower electrode part 174 disposed on a lower surface 160S2 of the second base device layer 160.

Referring to FIG. 4, the substrate 101 may include a semiconductor material. Specifically, the semiconductor material may include silicon (Si), germanium (Ge), gallium arsenide (GaAs), and the like. The substrate 101 may be doped with an n-type or p-type dopant. For example, the substrate 101 may include a well region doped with an n-type or p-type dopant. The substrate 101 may include transistors constituting an integrated circuit. The integrated circuit may include a driver circuit that drives the first and second unit cells UC1 and UC2.

Referring to FIGS. 3 and 4, the first and second pillar electrodes 110 and 120 may be disposed to extend in a vertical direction substantially perpendicular to a surface 101S of the substrate 101, that is, the z-direction. The first and second pillar electrodes 110 and 120 may be electrically connected to the substrate 101. The first and second pillar electrodes 110 and 120 may be disposed to be spaced apart from each other in a lateral direction (e.g., the x-direction). The first and second pillar electrodes 110 and 120 may be commonly provided to the first unit cell UC1 and the second unit cell UC2.

Referring to FIG. 3, each of the first and second pillar electrodes 110 and 120 may have a circular planar shape. Accordingly, each of the first and second pillar electrodes 110 and 120 may have a cylindrical shape. In some other embodiments, the planar shape of each of the first and second pillar electrodes 110 and 120 may have an elliptical shape or a polygonal shape. Accordingly, the first and second pillar electrodes 110 and 120 may have the shape of an elliptical pillar or a polygonal pillar.

Each of the first and second pillar electrodes 110 and 120 may include a conductive material. The conductive material may include, for example, silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The first and second unit cells UC1 and UC2 may be disposed between the first and second pillar electrodes 110 and 120. The first and second unit cells UC1 and UC2 may be disposed along the vertical direction (i.e., the z-direction).

The first unit cell UC1 may include the first and second shared device layers 130 and 140 disposed adjacent to the first and second pillar electrodes 110 and 120, respectively. The first and second shared device layers 130 and 140 may extend in the vertical direction (i.e., the z-direction). The first and second shared device layers 130 and 140 may be shared by the second unit cell UC2, which is positioned below the first unit cell UC1.

In an embodiment, the first shared device layer 130 may be disposed to surround the first pillar electrode 110, and the second shared device layer 140 may be disposed to surround the second pillar electrode 120. In an embodiment, the first shared device layer 130 may have a cylindrical shape including the first pillar electrode 110 therein, and the second shared device layer 140 may have a cylindrical shape including the second pillar electrode 120 therein.

In addition, the first unit cell UC1 may include the first and second base device layers 150 and 160 disposed on a first plane PL1 over the substrate 101 and between the first and second shared device layers 130 and 140. The first plane PL1 may be substantially parallel to the surface 101S of the substrate 101. As shown in FIG. 6, the first base device layer 150 may contact the first shared device layer 130 to form a first interface ILL, and may contact the second base device layer 160 to form a second interface IL2. The second base device layer 160 may contact the second shared device layer 140 to form a third interface IL3.

In an embodiment, each of the first shared device layer 130 and the second base device layer 160 may include a p-type metal oxide semiconductor material including a p-type carrier (i.e., hole). In this case, the concentration of the p-type carrier in the first shared device layer 130 may be higher than the concentration in the second base device layer 160. For example, the first shared device layer 130 may be a high-concentration carrier layer having a hole concentration of $1\times10^{20}$ $cm^{-3}$ or higher. The second base device layer 160 may have the hole concentration of $1\times10^{15}$ $cm^{-3}$ to $1\times10^{18}$ $cm^{-3}$. The p-type metal oxide semiconductor material may include, for example, SnO, CuO, $Cu_2O$, NiO, $Co_3O_4$, $Cr_2O_3$, or a combination of two or more thereof.

In an embodiment, each of the second shared device layer 140 and the first base device layer 150 may include an n-type metal oxide semiconductor material including an n-type carrier (i.e., electron). In this case, the concentration of the n-type carrier in the second shared device layer 140 may be higher than the concentration of the n-type carrier in the first base device layer 150. For example, the second shared device layer 140 may be a high-concentration carrier layer having an electron concentration of $1\times10^{20}$ $cm^{-3}$ or higher. The first base device layer 150 may have an electron concentration of $1\times10^{15}$ $cm^{-3}$ to $1\times10^{18}$ $cm^{-3}$. The n-type metal oxide semiconductor material may include, for example, $SnO_2$, $In_2O_3$, ZnO, indium zinc oxide (IZO), indium tin oxide (ITO), indium gallium oxide (IGO), or a combination of two or more thereof.

Referring to FIGS. 4 and 6, through the above configuration, the first shared device layer 130, the first base device layer 150, the second base device layer 160, and the second shared device layer 140 may sequentially form a PNPN diode junction. The first pillar electrode 110 in contact with the first shared device layer 130 may function as an anode electrode. In addition, the second pillar electrode 120 in contact with the second shared device layer 140 may function as a cathode electrode.

Referring to FIGS. 4 and 5, the control gate electrode 170 may be disposed adjacent to the second base device layer 160. The control gate electrode 170 may be disposed directly on and directly under the second base device layer 160 to electrically control the second base device layer 160 without controlling the first base device layer 150.

In an embodiment, the control gate electrode 170 may extend in a different direction from the first and second pillar electrodes 110 and 120. The control gate electrode 170 may have a line shape extending in a direction (e.g., the y-direction) substantially parallel to the surface 101S of the substrate 101.

The control gate electrode 170 may include the upper electrode part 172 disposed on an upper surface 160S1 of the second base device layer 160 and a lower electrode part 174 disposed on a lower surface 160S2 of the second base device layer 160. In an embodiment, during the operation of the semiconductor device 10, the upper electrode part 172 and the lower electrode part 174 may be controlled to have the same electric potential. Accordingly, compared to an example in which only one of the upper electrode part 172 and the lower electrode part 174 is included in a semiconductor device 10, the control gate electrode 170 can more effectively control the distribution and concentration of the holes in the second base device layer 160.

In some embodiments (not illustrated), the control gate electrode 170 may include only one of the upper electrode part 172 and the lower electrode part 174. The control gate electrode 170 can appropriately control the distribution and concentration of the holes in the second base device layer 160 using only one of the upper electrode part 172 and the lower electrode part 174.

The control gate electrode 170 may include a conductive material. The conductive material may include, for example, doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 4 and 5, gate dielectric layers 165 may be disposed between the control gate electrode 170 and the second base device layer 160. In addition, the gate dielectric layers 165 may be additionally disposed between the control gate electrode 170 and interlayer insulation layers 102 and between the control gate electrode 170 and first and second gate isolating insulation layers 103 and 104.

The gate dielectric layer 165 may include a dielectric material. The dielectric material may include, for example, a paraelectric material, a ferroelectric material, an anti-ferroelectric material, or a combination thereof. The dielectric material may include, for example, silicon oxide, silicon nitride, aluminum oxide, hafnium nitride, zirconium nitride, hafnium zirconium nitride, or a combination of two or more thereof.

The interlayer insulation layers 102 may function to isolate the first unit cell UC1 from other unit cells (e.g., the second unit cell UC2) in the vertical direction (i.e., the z-direction). The interlayer insulation layers 102 may have electrical insulating properties. Each of the interlayer insulation layers 102 may include, for example, oxide, nitride, oxynitride, or a combination of two or more thereof.

The first gate isolating insulation layers 103 may be disposed between the first shared device layer 130 and the gate dielectric layer 165 in the lateral direction (e.g., the x-direction). The first gate isolating insulation layers 103 may isolate the first shared device layer 130 and the gate dielectric layer 165 from each other. The second gate isolating insulation layers 104 may be disposed between the second shared device layer 140 and the control gate electrode 170. The second gate isolating insulation layers 104 may isolate the second shared device layer 140 and the control gate electrode 170 from each other. Each of the first and second gate isolating insulation layers 103 and 104 may have electrical insulating properties. Each of the first and second gate isolating insulation layers 103 and 104 may include, for example, oxide, nitride, oxynitride, or a combination of two or more thereof.

Referring to FIG. 4, the second unit cell UC2 may be disposed below the first unit cell UC1. The configuration of the second unit cell UC2 may be substantially the same as the configuration of the first unit cell UC1. In an embodiment, the second unit cell UC2 may share the first and second pillar electrodes 110 and 120, and the first and second shared device layers 130 and 140, with the first unit cell UC1. The second unit cell UC2 may include the first and second base device layers 150 and 160 disposed on a second plane PL2 over the substrate 101 between the first and second shared device layers 130 and 140. The second plane PL2 may be substantially parallel to the surface 101S of the substrate 101.

In addition, the second unit cell UC2 may include the control gate electrode 170 that is disposed adjacent to the second base device layer 160, and the second unit cell UC2 may have an upper electrode part 172 and a lower electrode part 174. The control gate electrode 170 of the second unit cell UC2 may be electrically isolated from the control gate electrode 170 of the first unit cell UC1.

The second unit cell UC2 may be isolated from the substrate 101 and the first unit cell UC1 by the interlayer insulation layers 102. In addition, the control gate electrode 170 of the second unit cell UC2 may be isolated from the first and second shared device layers 130 and 140 by the first and second gate isolating insulation layers 103 and 104.

As described above, a semiconductor device according to an embodiment of the present disclosure may include first and second pillar electrodes each extending in the vertical direction substantially perpendicular to the surface of a substrate. The semiconductor device may include a plurality of memory cells disposed between the first and second pillar electrodes. Each of the plurality of memory cells may include first and second shared device layers disposed to extend along the vertical direction, and first and second base device layers disposed on a plane over the substrate. A control gate electrode may be disposed adjacent to one of the first and second base device layers.

According to an embodiment of the present disclosure, the first and second pillar electrodes corresponding to an anode line and a cathode line of the thyristor, respectively, and the first and second shared device layers, which are high-concentration carrier layers, may be disposed to be shared by the plurality of memory cells along the vertical direction. The control gate electrode corresponding to a control gate line of the thyristor may be disposed, however, to extend in a direction different from the vertical direction. Using this configuration, it is possible to provide a semiconductor device in which a plurality of memory cells are disposed in a structure to form thyristors that are efficiently integrated in three dimensions.

FIGS. 7A to 20A are schematic plan views illustrating a method of manufacturing a semiconductor device according to an embodiment of the present disclosure. FIGS. 7B to 20B are cross-sectional views of structures shown in FIGS. 7A to 20A taken along a line A-A' and shown on an x-y plane. The method of manufacturing a semiconductor device according to FIGS. 7A to 20A and FIGS. 7B to 20B may be applied to a method of manufacturing a semiconductor device 10 described above with reference to FIGS. 3 to 6.

Figure 7A:
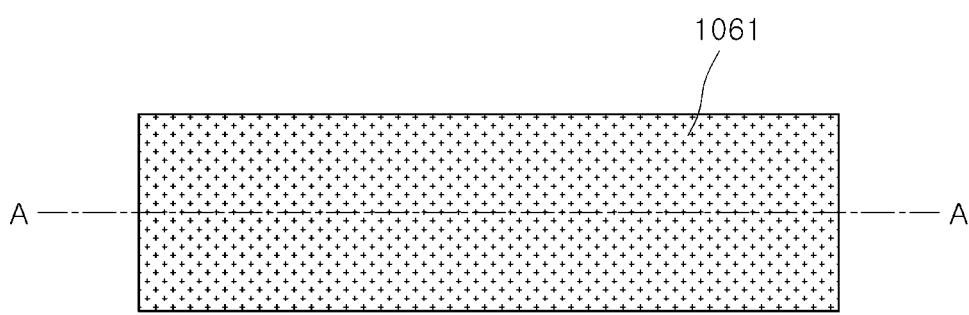
Figure 7A:
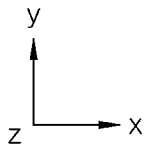
Figure 7B:
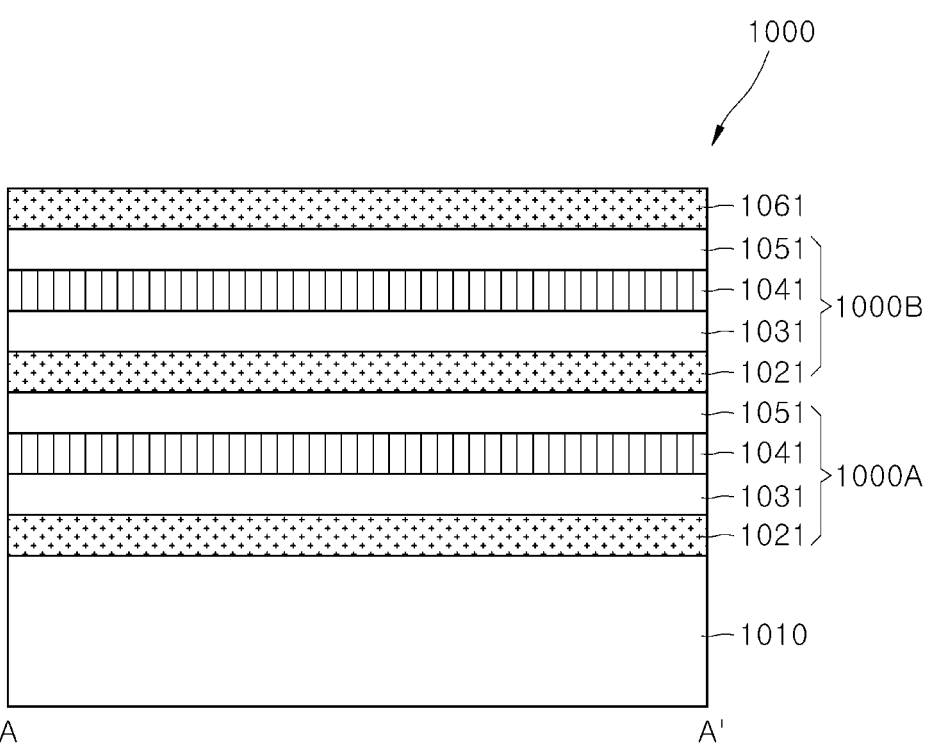
Figure 7B:
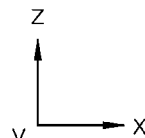

Referring to FIGS. 7A and 7B, a cell stack structure 1000 may be formed over a substrate 1010. The cell stack structure 1000 may include first and second stack structures 1000A and 1000B. In addition, the cell stack structure 1000 may include an upper insulation layer 1061 formed on the second stack structure 1000B.

The substrate 1010 may include a semiconductor material. Specifically, the semiconductor material may include silicon (Si), germanium (Ge), gallium arsenide (GaAs), and the like. The substrate 1010 may be doped with an n-type or p-type dopant. For example, the substrate 1010 may include a well region doped with an n-type or p-type dopant. The substrate 1010 may include transistors constituting an integrated circuit. The integrated circuit may include a driver circuit for driving semiconductor device memory cells.

Each of the first and second stack structures 1000A and 1000B may include an interlayer insulation layer 1021, a first gate sacrificial layer 1031, a base sacrificial layer 1041, and a second gate sacrificial layer 1051 which are sequentially stacked.

The interlayer insulation layer 1021, the first and second gate sacrificial layers 1031 and 1051, and the base sacrificial layer 1041 may have an etch selectivity to each other. In an embodiment, the interlayer insulation layer 1021 may include oxide, each of the first and second gate sacrificial layers 1031 and 1051 may include nitride, and the base sacrificial layer 1041 may include a semiconductor material. For example, the interlayer insulation layer 1021 may be a silicon oxide layer, each of the first and second gate sacrificial layers 1031 and 1051 may be a silicon nitride layer, and the base sacrificial layer 1041 may be a silicon layer. The upper insulation layer 1061 may be disposed on the second gate sacrificial layer 1051 of the second stack structure 1000B. The upper insulation layer 1061 may have substantially the same configuration as the interlayer insulation layer 1021. The interlayer insulation layer 1021, the first and second gate sacrificial layers 1031 and 1051, the base sacrificial layer 1041, the upper insulation layer 1061 may be formed using, for example, a chemical vapor deposition method, an atomic layer deposition method, a coating method, a physical vapor deposition method, and the like.

Meanwhile, in connection with FIGS. 7A and 7B, although two cell stack structures 1000A and 1000B are illustrated, the number of cell stack structures is not necessarily limited to two, and various numbers are possible, corresponding to the number of formed unit cells.

Figure 8A:
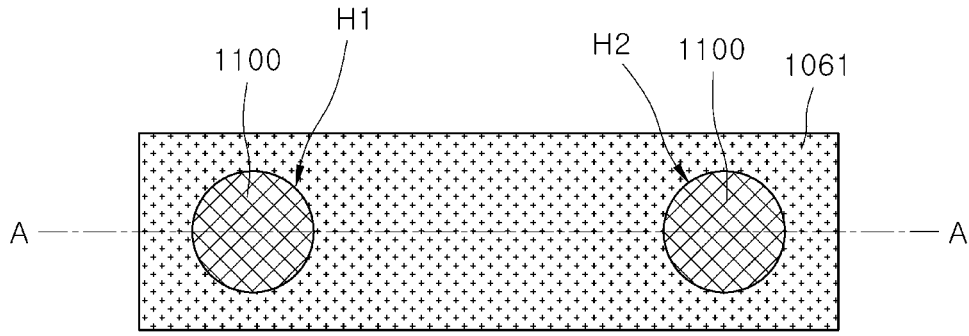
Figure 8A:
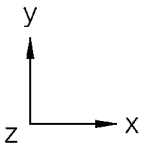
Figure 8B:
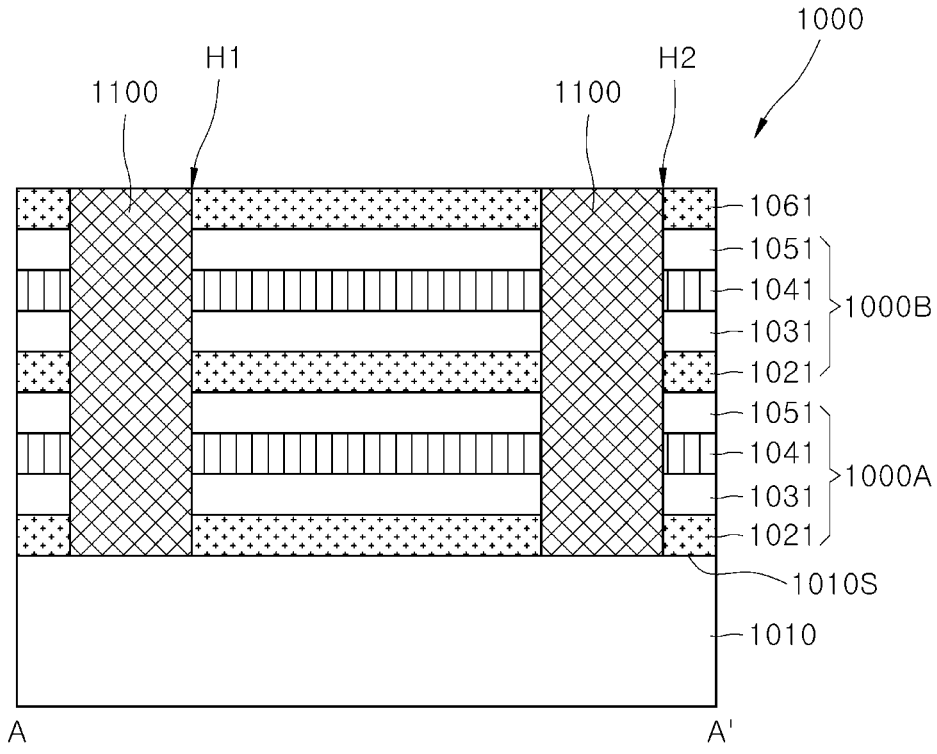
Figure 8B:
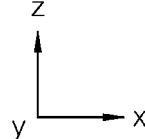

Referring to FIGS. 8A and 8B, first and second hole patterns H1 and H2 may be formed to penetrate the cell stack structure 1000 on the substrate 1010. The first and second hole patterns H1 and H2 may be disposed to be spaced apart from each other in a lateral direction (e.g., the x-direction), which is substantially parallel to a surface 1010S of the substrate 1010. The first and second hole patterns H1 and H2 may expose the substrate 1010. In addition, the first and second hole patterns H1 and H2 may expose sidewalls of the cell stack structure 1000. Accordingly, in the first and second hole patterns H1 and H2, side surfaces of the interlayer insulation layers 1021, the first and second gate sacrificial layers 1031 and 1051, the base sacrificial layers 1041, and the upper insulation layer 1061 may be exposed.

Subsequently, the first and second hole patterns H1 and H2 may be filled with a hole filling material 1100. The hole filling material 1100 may have an etch selectivity to each of the substrate 1010, the interlayer insulation layer 1021, the first and second gate sacrificial layers 1031 and 1051, the base sacrificial layer 1041, and the upper insulation layer 1061. In an embodiment, the hole filling material 1100 may include carbon (C). For example, the hole filling material 1100 may be a material containing silicon (Si), carbon (C), oxygen (O), and hydrogen (H), for example, SiCOH.

Figure 9A:
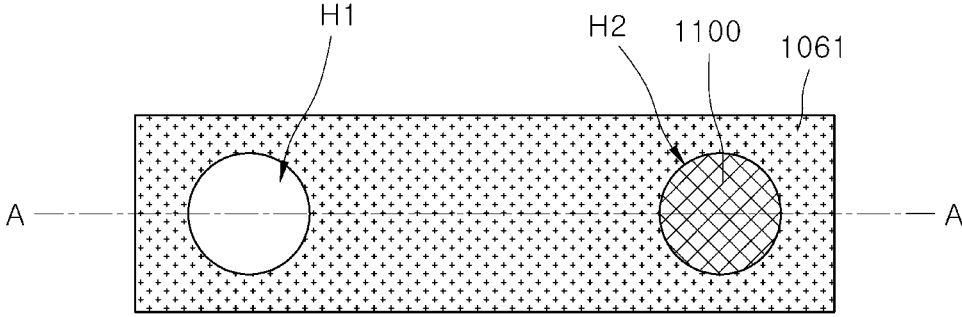
Figure 9A:
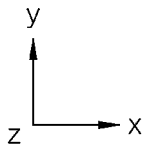
Figure 9B:
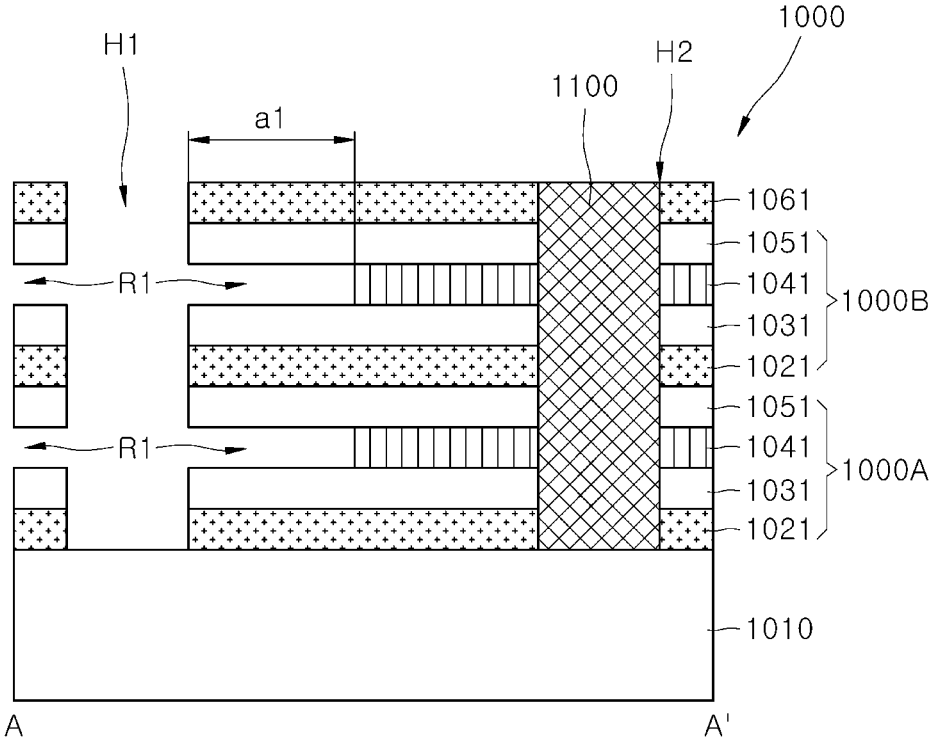
Figure 9B:
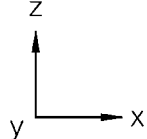

Referring to FIGS. 9A and 9B, the hole filling material 1100 in the first hole pattern H1 may be removed. Next, the base sacrificial layers 1041 may be selectively recessed to form first base recess spaces R1 in the first hole pattern H1. In an embodiment, the base sacrificial layers 1041 may be selectively recessed by partially removing the base sacrificial layers 1041 through a wet etch method using the etch selectivity. In an embodiment, each of the first base recess spaces R1 may be formed to have a first recess distance a1 in a lateral direction (e.g., the x-direction) from an interface between the first hole pattern H1 and the cell stack structure 1000.

Figure 10A:
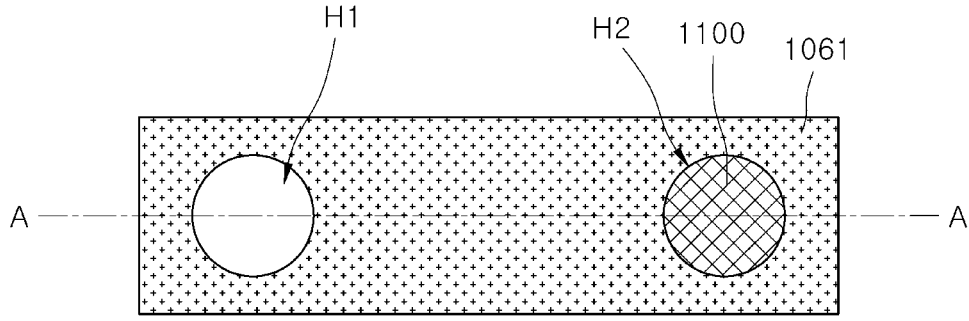
Figure 10A:
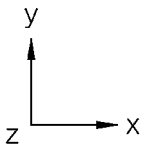
Figure 10B:
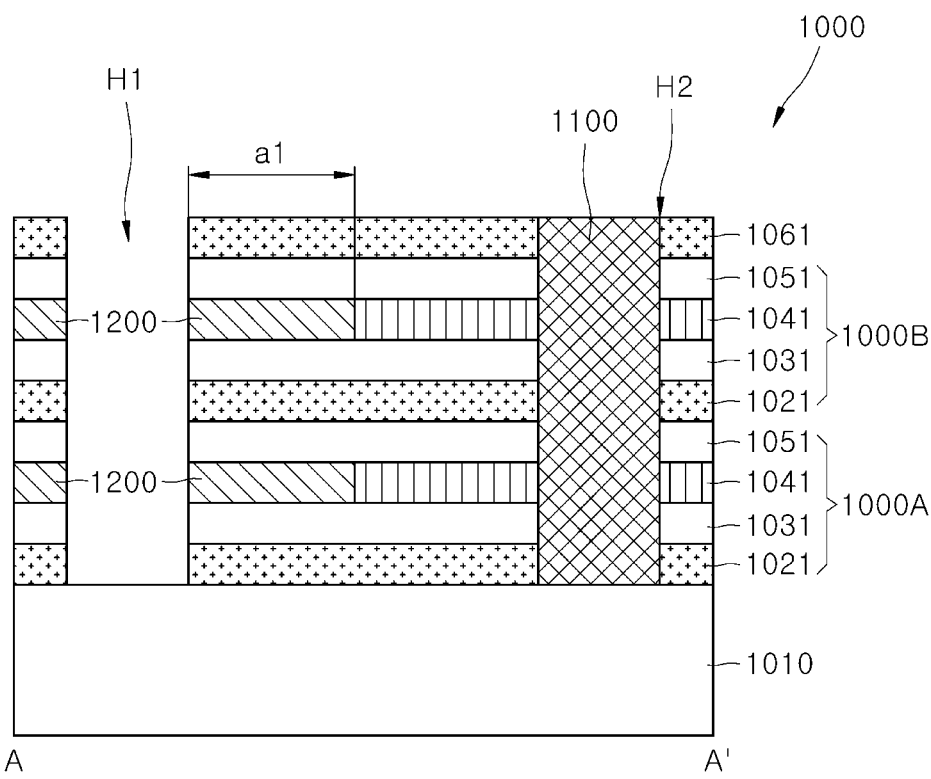
Figure 10B:
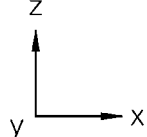

Referring to FIGS. 10A and 10B, first base device layers 1200 each including an n-type metal oxide semiconductor material may be formed in the first base recess spaces R1. The first base device layers 1200 may be formed to fill first base recess spaces R1.

Each of the first base device layers 1200 may include an n-type carrier (i.e., electron) having a concentration of $1 \times 10^{15}$ cm$^{-3}$ to $1 \times 10^{18}$ cm$^{-3}$. The n-type metal oxide semiconductor material may include, for example, $SnO_2$, $In_2O_3$, ZnO, indium zinc oxide (IZO), indium tin oxide (ITO), indium gallium oxide (IGO), or a combination of two or more thereof. The first base device layers 1200 may be formed by using, for example, a chemical vapor deposition method, an atomic layer deposition method, a sputtering method, a laser deposition method, a solution coating method, and the like.

Figure 11A:
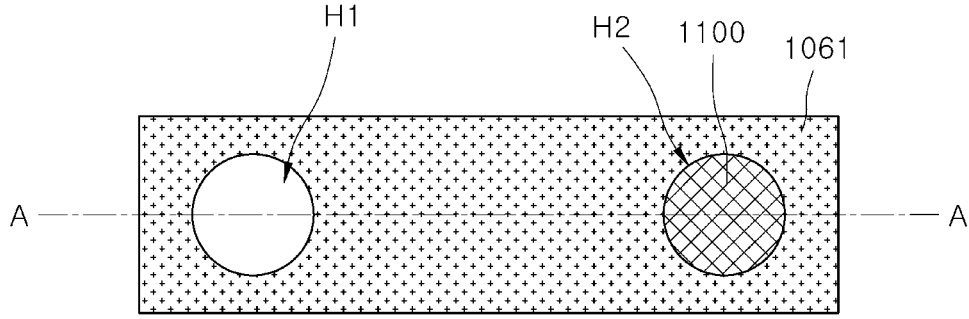
Figure 11A:
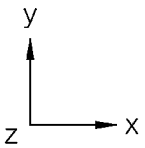
Figure 11B:
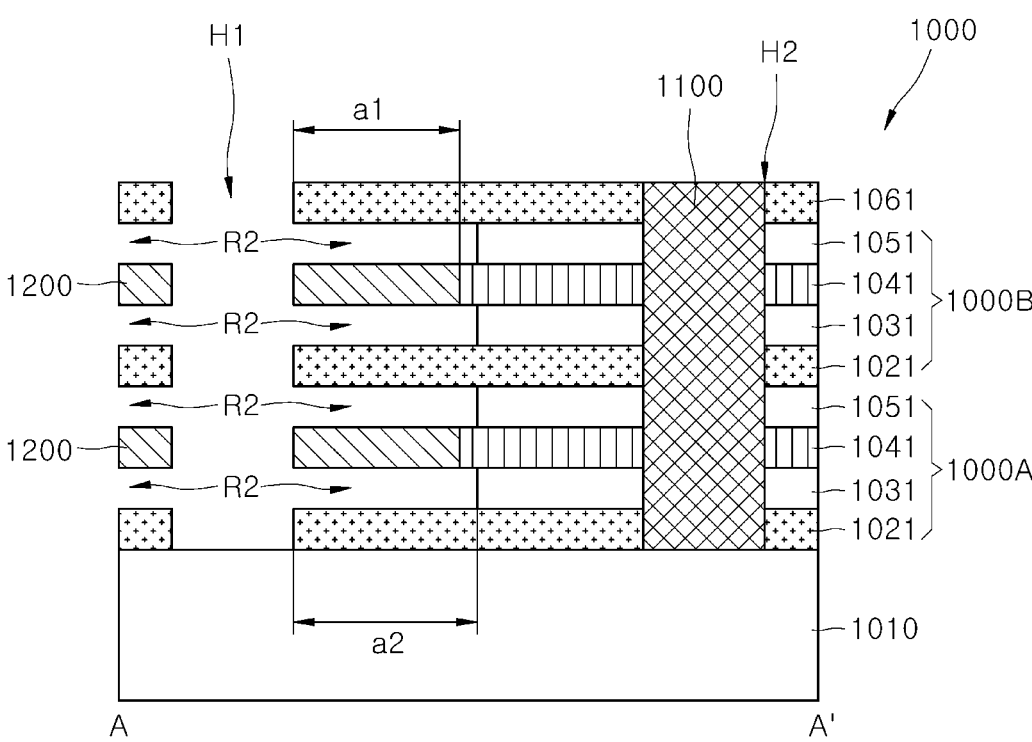
Figure 11B:
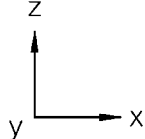

Referring to FIGS. 11A and 11B, in the first hole pattern H1, the first and second gate sacrificial layers 1031 and 1051 may be selectively recessed to form first gate recess spaces R2. In an embodiment, the first and second gate sacrificial layers 1031 and 1051 may be selectively recessed by partially removing the first and second gate sacrificial layers 1031 and 1051 by a wet etch method using the etch selectivity. In an embodiment, each of the first gate recess spaces R2 may be formed to have a second recess distance a2 from an interface between the first hole pattern H1 and the cell stack structure 1000 in the lateral direction (e.g., the x-direction). The second recess distance a2 may be greater than the first recess distance at.

Figure 12A:
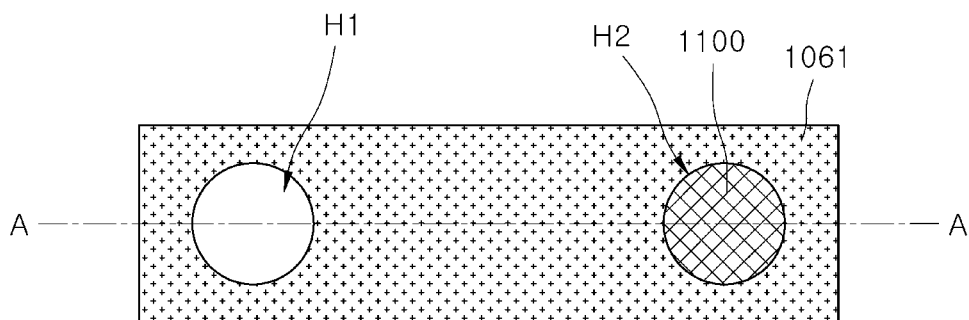
Figure 12A:
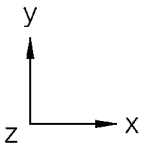
Figure 12B:
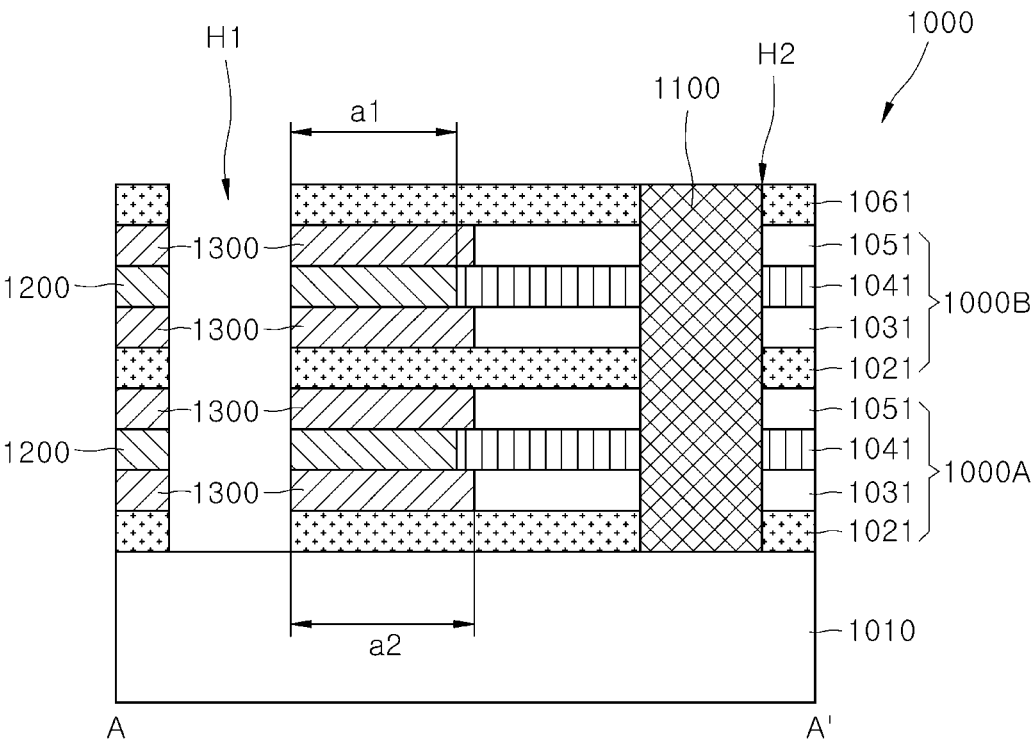
Figure 12B:
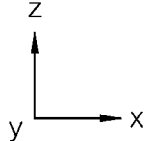

Referring to FIGS. 12A and 12B, the first gate recess spaces (R2 of FIG. 11B) may be filled with an insulating material to form first gate isolation layers 1300. The insulating material may include, for example, oxide, nitride, oxynitride, or a combination of two or more thereof. The first gate isolation layers 1300 may be formed using, for example, a chemical vapor deposition method, an atomic layer deposition method, and the like.

Figure 13A:
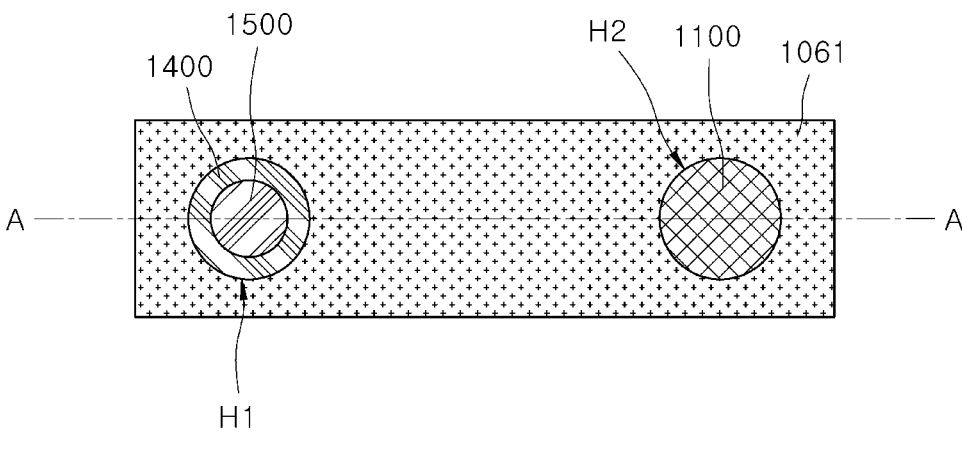
Figure 13A:
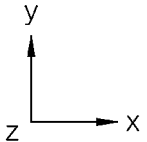
Figure 13B:
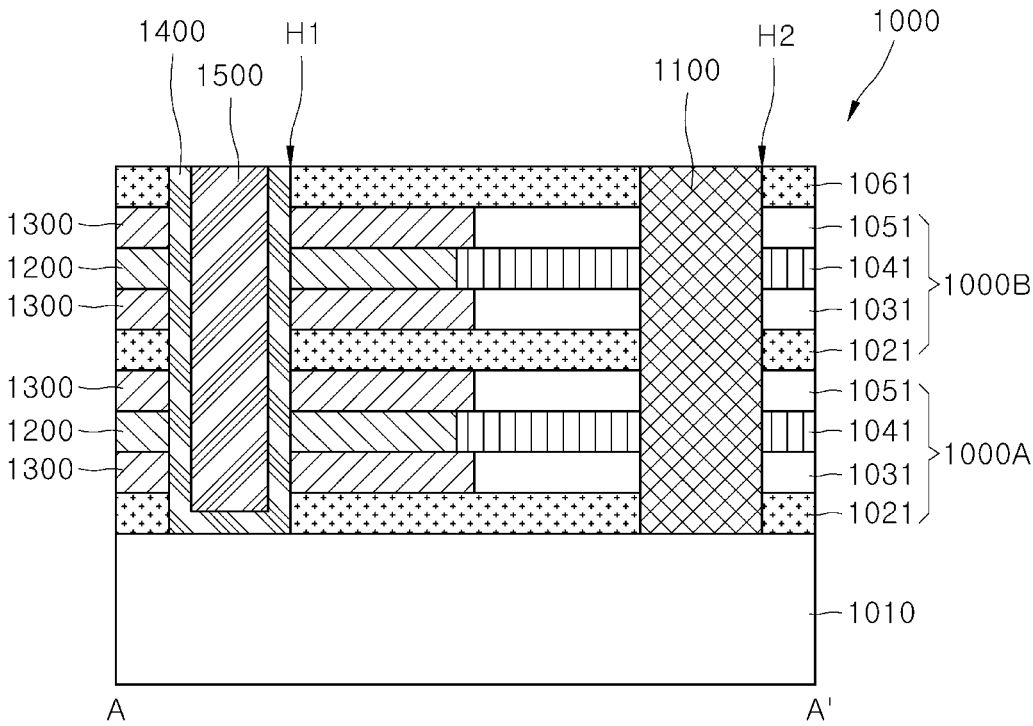
Figure 13B:
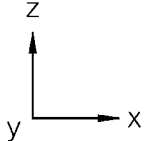

Referring to FIGS. 13A and 13B, a first shared device layer 1400 may be formed on an inner surface of the first hole pattern H1. In an embodiment, the first shared device layer 1400 may extend in the z-direction along the sidewall of the cell stack structure 1000 inside the first hole pattern H1. The first shared device layer 1400 may include a p-type metal oxide semiconductor material. The first shared device layer 1400 may be a high-concentration carrier layer in which the concentration of p-type carriers (i.e., holes) is $1 \times 1020$ cm$^{-3}$ or higher. The p-type metal oxide semiconductor material may include, for example, SnO, CuO, $Cu_2O$, NiO, $CO_3O_4$, $Cr_2O_3$, or a combination of two or more thereof. The first shared device layer 140 may be formed using, for example, a chemical vapor deposition method, an atomic layer deposition method, a sputtering method, a laser deposition method, a solution coating method, and the like.

Subsequently, a first pillar electrode 1500 may be formed in the first hole pattern H1 in which the first shared device layer 1400 is formed. The process of forming the first pillar electrode 1500 may include a process of filling the first hole pattern H1 with a conductive material. The conductive material may include, for example, a doped semiconductor material, metal, conductive metal nitride, conductive metal carbide, conductive metal silicide, conductive metal oxide, and a combination of two or more thereof. The first pillar electrode 1500 may be formed using, for example, a chemical vapor deposition, an atomic layer deposition method, a sputtering method, and the like.

Figure 14A:
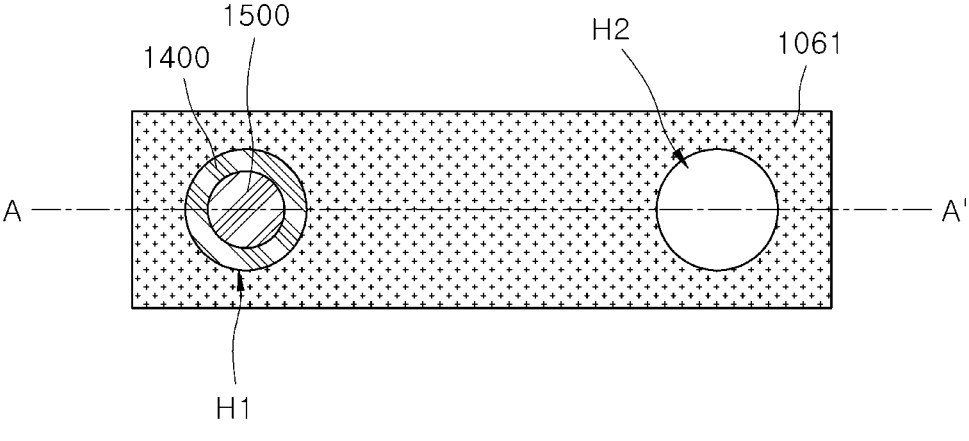
Figure 14A:
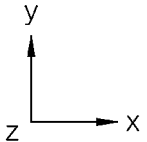
Figure 14B:
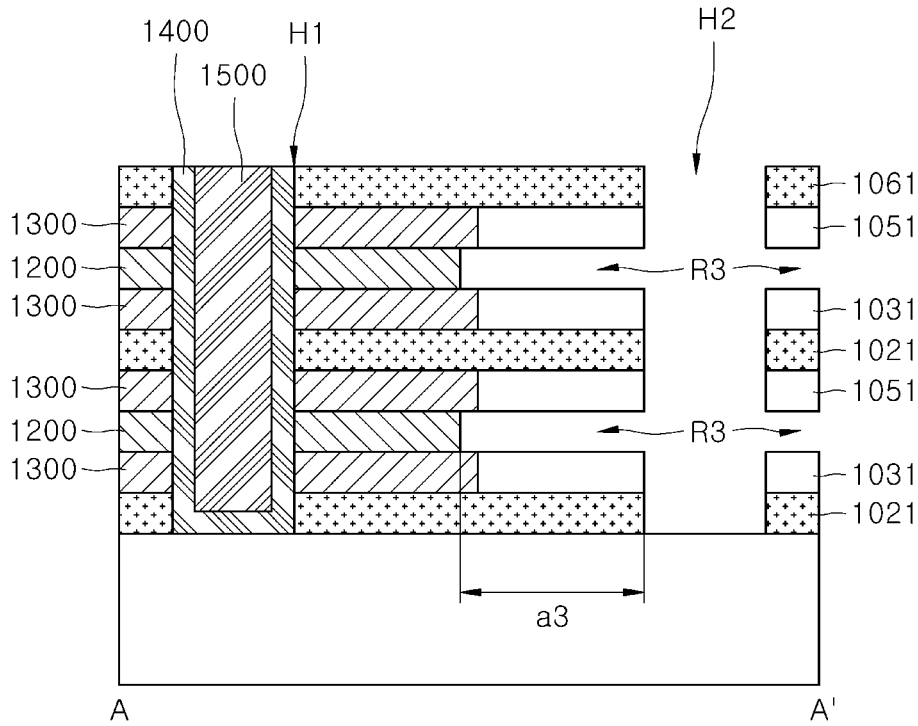
Figure 14B:
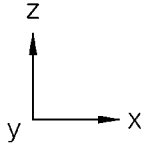

Referring to FIGS. 14A and 14B, the hole filling material 1100 in the second hole pattern H2 may be removed. Subsequently, the base sacrificial layers 1041 may be selectively recessed to form second base recess spaces R3 in the second hole pattern H2. As a result, the second base recess spaces R3 may expose the first base device layers 1200 in the lateral direction (e.g., the x-direction).

In an embodiment, the process of selectively recessing the base sacrificial layers 1041 may proceed by partially removing the base sacrificial layers 1041 by a wet etch method using the etch selectivity. In an embodiment, each of the second base recess spaces R3 may be formed to have a third recess distance a3 from an interface between the second hole pattern H2 and the cell stack structure 1000 in the lateral direction (e.g., the x-direction).

Figure 15A:
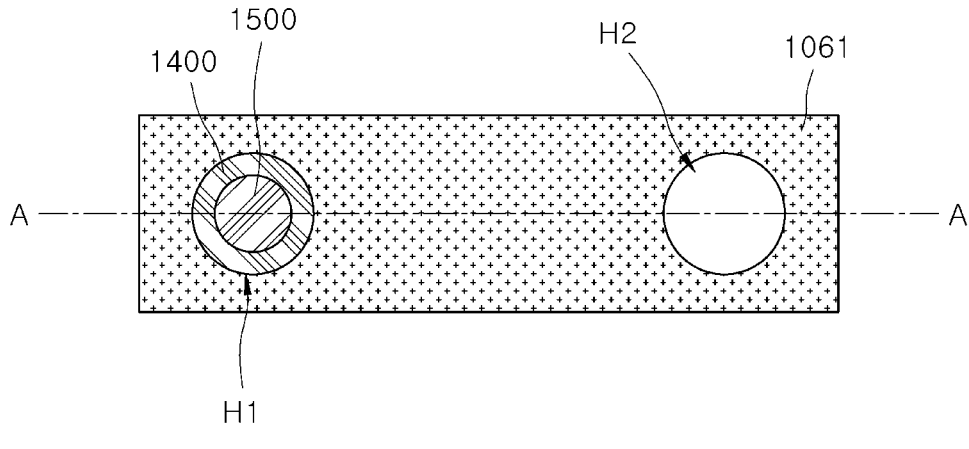
Figure 15A:
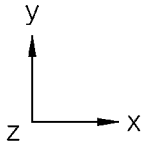
Figure 15B:
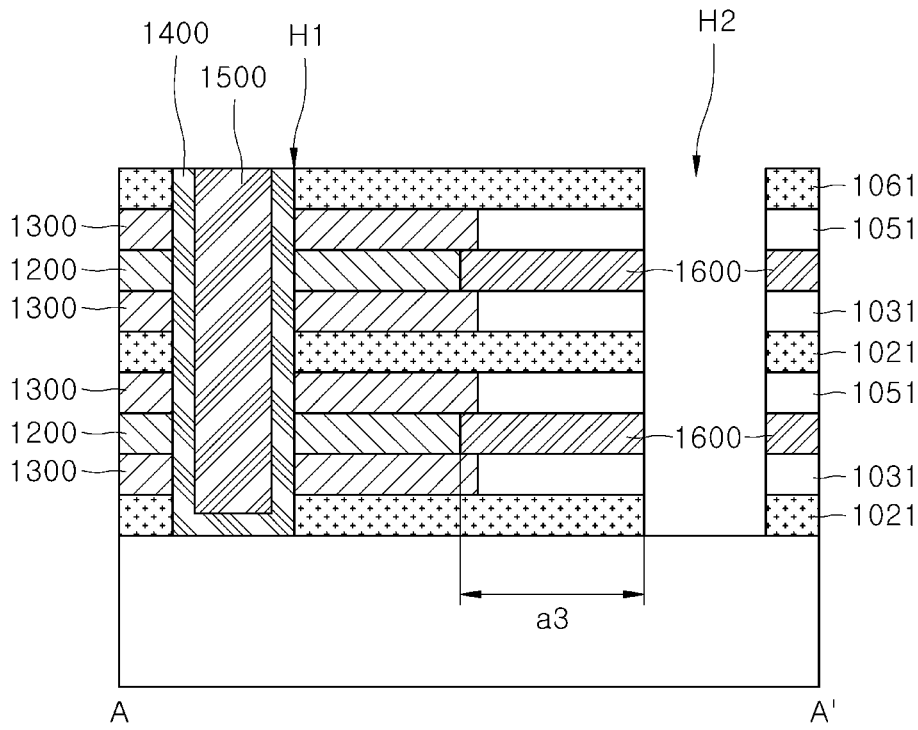
Figure 15B:
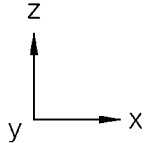

Referring to FIGS. 15A and 15B, second base device layers 1600 each including a p-type metal oxide semiconductor material may be formed in the second base recess spaces (R3 of FIG. 14B). The second base device layers 1600 may be formed to fill the second base recess spaces (R3 of FIG. 14B).

Each of the second base device layers 1600 may include a p-type metal oxide semiconductor material. The second base device layer 1600 may include a p-type carrier (i.e., hole) having a concentration of $1 \times 10^{15}$ cm$^{-3}$ to $1 \times 10^{18}$ cm$^{-3}$. The concentration of the p-type carrier of the second base device layer 1600 may be lower than the concentration of the p-type carrier of the first shared device layer 1400. The p-type metal oxide semiconductor material may include, for example, SnO, CuO, $Cu_2O$, NiO, $CO_3O_4$, $Cr_2O_3$, or a combination of two or more thereof. The second base device layers 1600 may be formed using, a chemical vapor deposition method, an atomic layer deposition method, a sputtering method, a laser deposition method, a solution coating method, and the like.

Figure 16A:
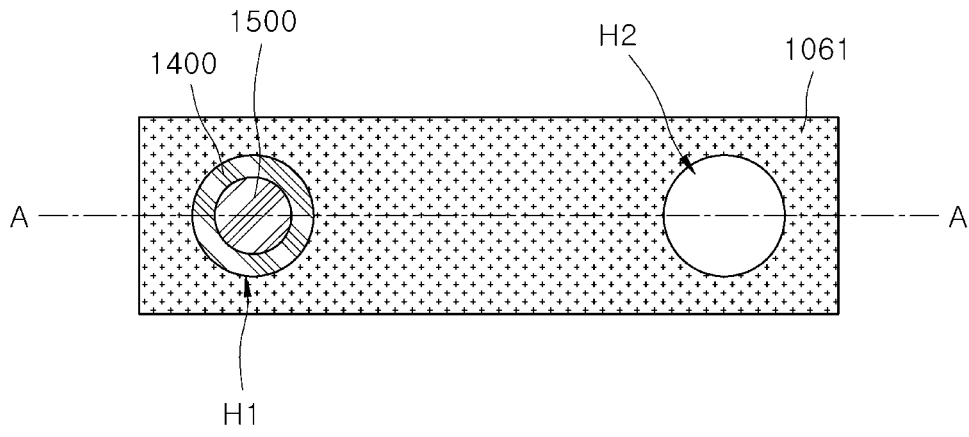
Figure 16A:
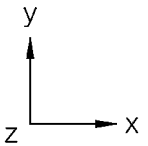
Figure 16B:
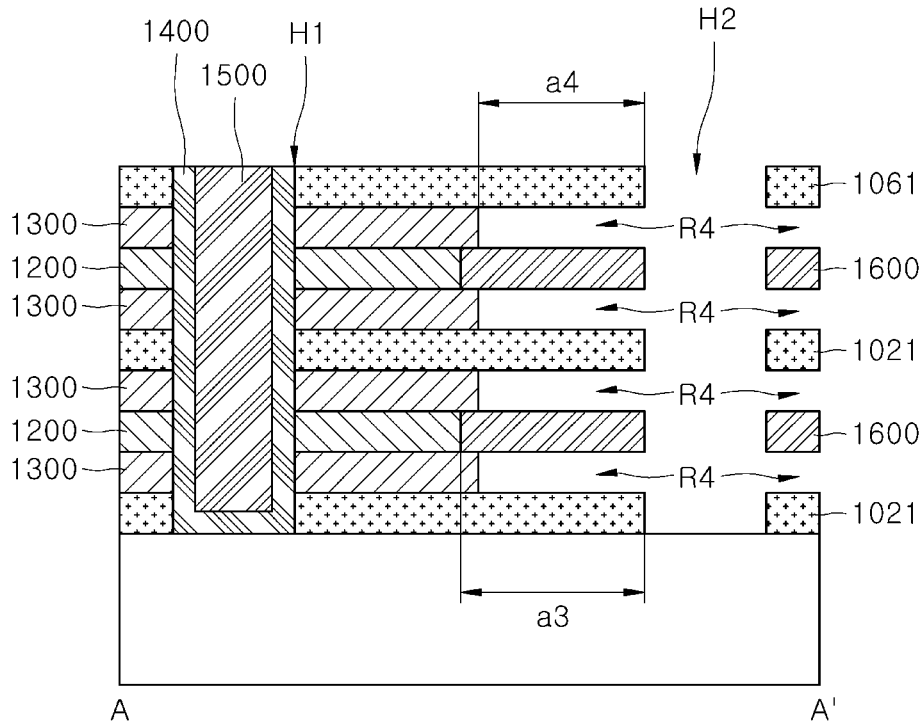
Figure 16B:
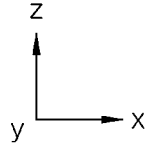

Referring to FIGS. 16A and 16B, inside the second hole pattern H2, the first and second gate sacrificial layers 1031 and 1051 may be selectively recessed to form second gate recess spaces R4. As a result, the second gate recess spaces R4 may expose the first gate isolation layer 1300 in the lateral direction (e.g., the x-direction).

In an embodiment, the process of selectively recessing the first and second gate sacrificial layers 1031 and 1051 may be proceed as a process of partially removing the first and second gate sacrificial layers 1031 and 1051 by a wet etch method using the etch selectivity. In an embodiment, each of the second gate recess spaces R4 may be formed to have a fourth recess distance a4 from an interface between the second hole pattern H2 and the cell stack structure 1000 in the lateral direction (e.g., the x-direction). The fourth recess distance a4 may be smaller than the third recess distance a3.

Figure 17A:
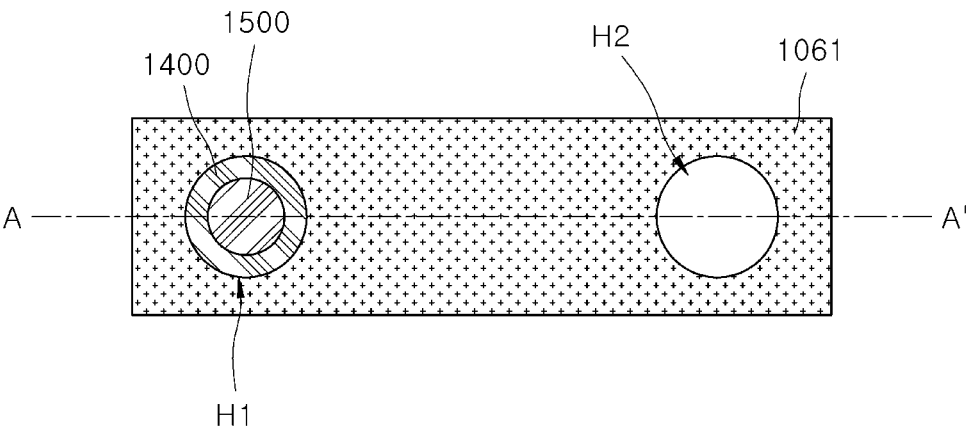
Figure 17A:
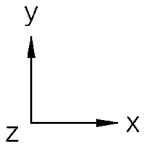
Figure 17B:
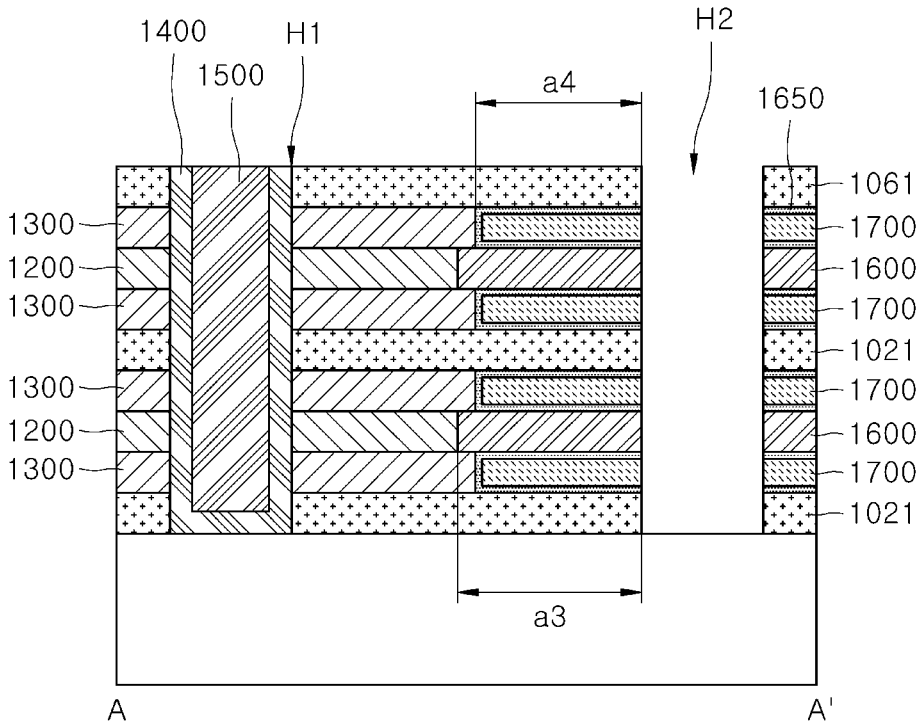
Figure 17B:
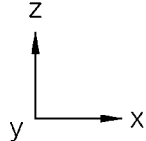

Referring to FIGS. 17A and 17B, dielectric material layers 1650 and conductive material layers 1700 may be sequentially formed in the second gate recess spaces (R4 of FIG. 16B). The dielectric material layers 1650 may be formed to cover the interlayer insulation layers 1021 (or the upper insulation layer 1061), the first gate isolation layers 1300, and the second base device layers 1600 in the second gate recess spaces (R4 of FIG. 16B). The dielectric material layer 1650 may include, for example, a paraelectric material, a ferroelectric material, an anti-ferroelectric material, or a combination thereof. The dielectric material layer 1650 may include, for example, silicon oxide, silicon nitride, aluminum oxide, hafnium nitride, zirconium nitride, hafnium zirconium nitride, or a combination of two or more thereof. The dielectric material layer 1650 may be formed using, for example, a chemical vapor deposition method, an atomic layer deposition method, and the like.

The conductive material layers 1700 may be formed in the second gate recess spaces (R4 of FIG. 16B) in which the dielectric material layers 1650 are formed. The conductive material layer 1700 may include, for example, doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The conductive material layer 1700 may be formed using, for example, a chemical vapor deposition method, an atomic layer deposition method, and the like.

Figure 18A:
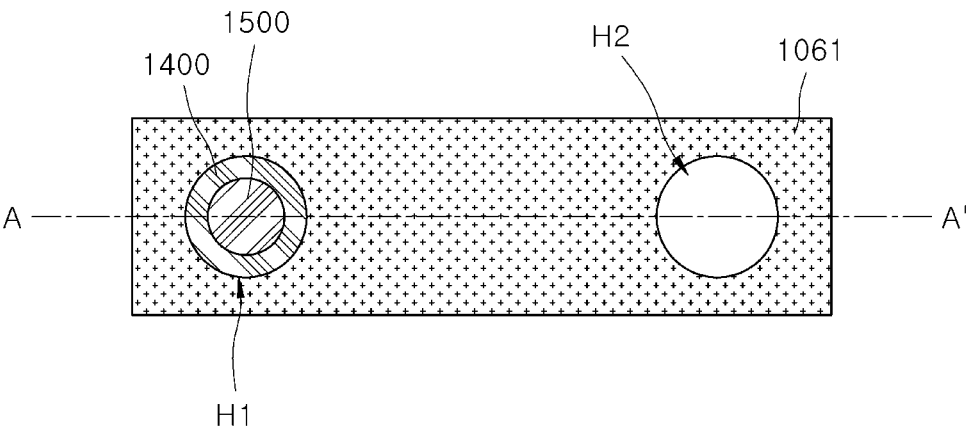
Figure 18A:
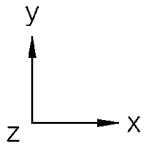
Figure 18B:
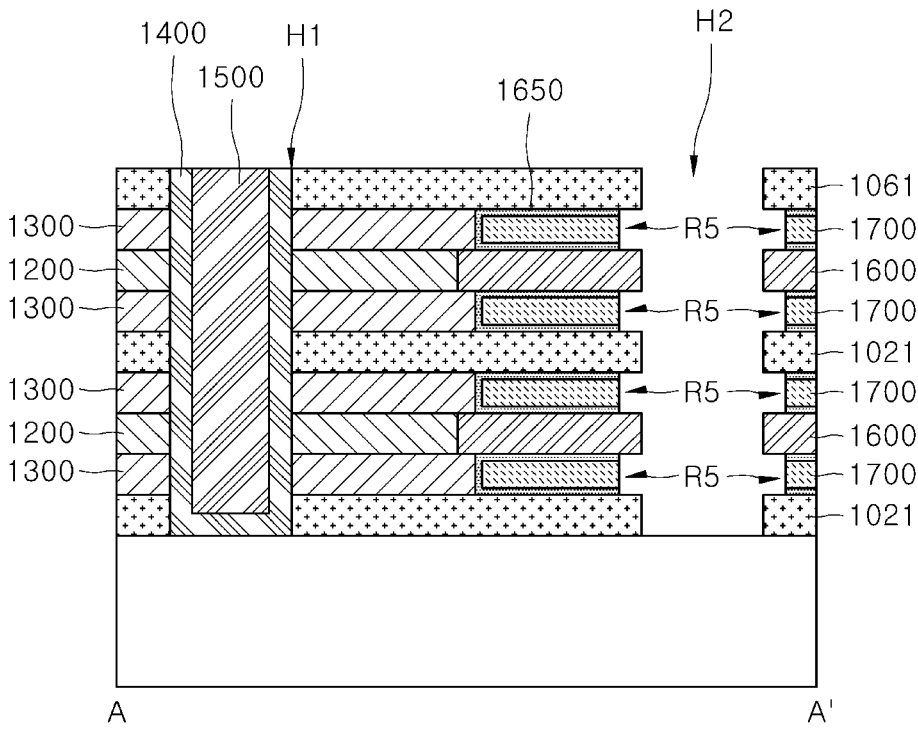
Figure 18B:
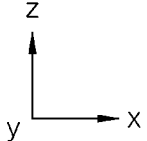

Referring to FIGS. 18A and 18B, the dielectric material layers 1650 and the conductive material layers 1700 may be recessed to form third gate recess spaces R5. In an embodiment, the process of forming the third gate recess spaces R5 may be performed by applying a wet etch process.

Figure 19A:
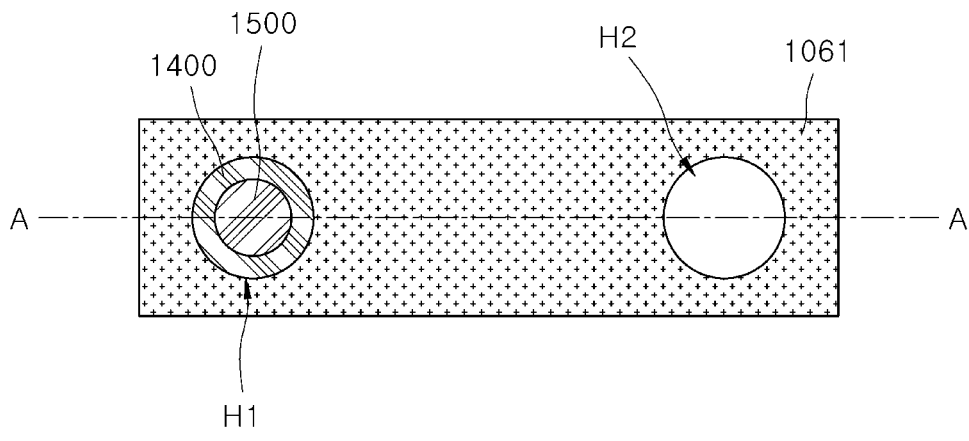
Figure 19A:
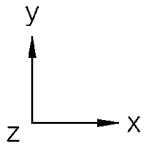
Figure 19B:
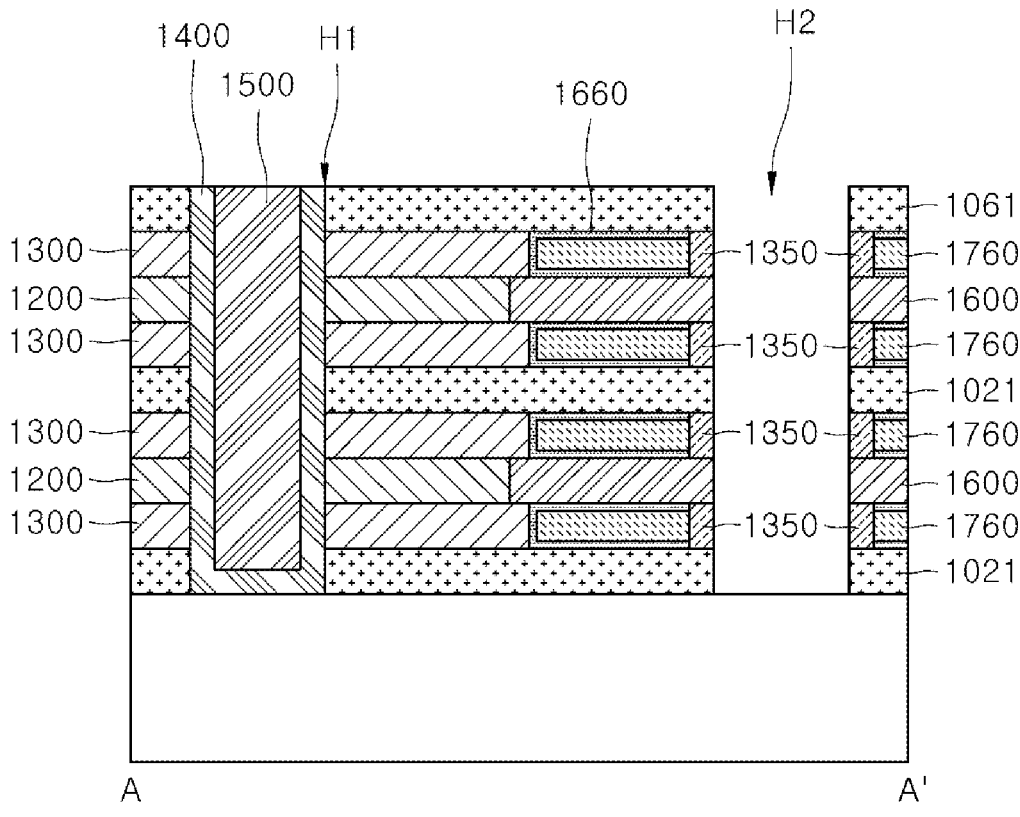
Figure 19B:
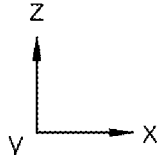

Referring to FIGS. 19A and 19B, the third gate recess spaces (R5 of FIG. 18B) may be filled with an insulating material 1350. After the third gate recess spaces are filled with the insulating material 1350, gate dielectric layers 1660 and control gate electrode layers 1760 may be formed from the dielectric material layers 1650 and the conductive material layers 1700.

Figure 20A:
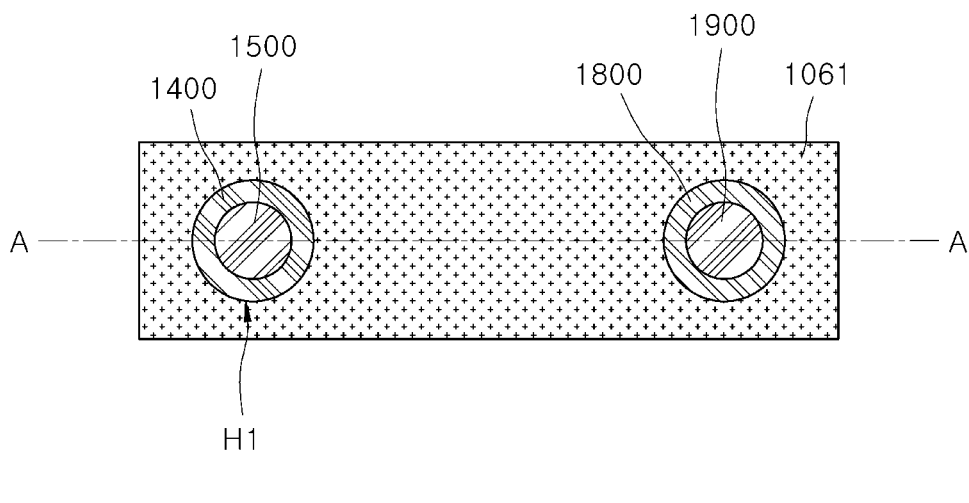
Figure 20A:
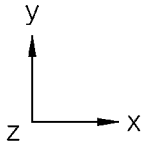
Figure 20B:
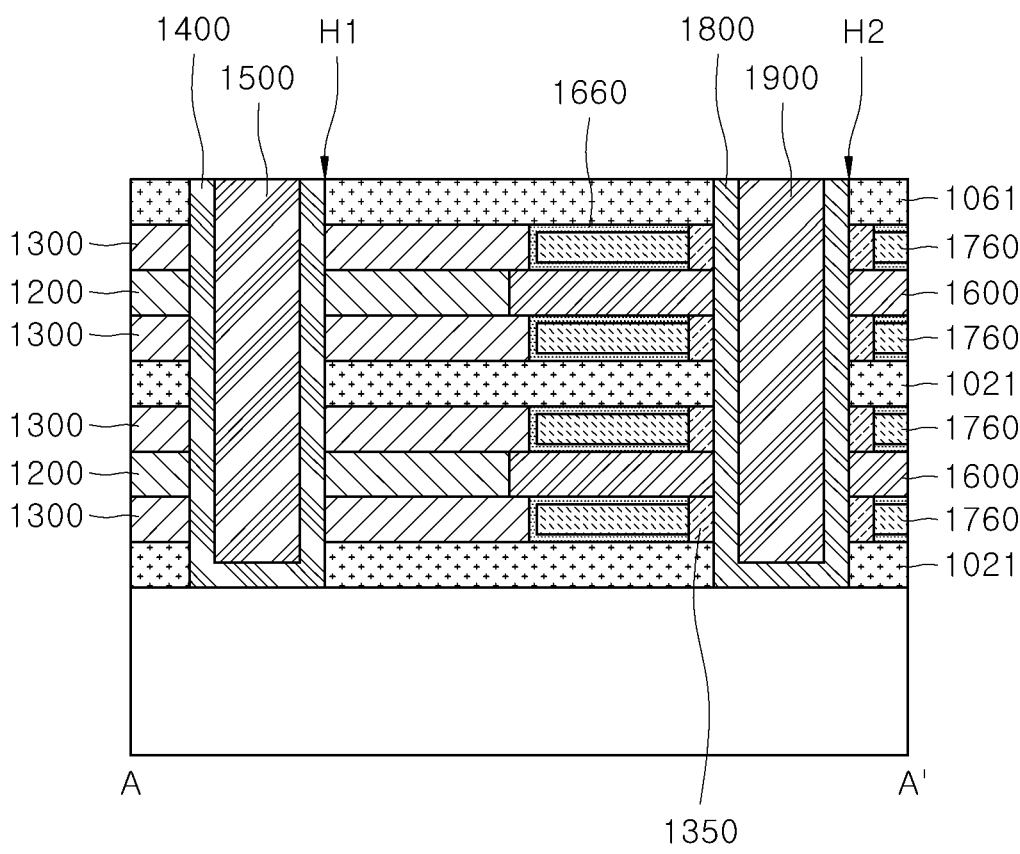
Figure 20B:
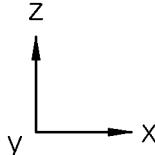

Referring to FIGS. 20A and 20B, in the second hole pattern H2, a second shared device layer 1800 may be formed on an inner surface of the cell stack structure 1000. In an embodiment, the second shared device layer 1800 may extend in the z-direction along the sidewall of the cell stack structure 1000. The second shared device layer 1800 may include an n-type metal oxide semiconductor material. The second shared device layer 1800 may be a high-concentration carrier layer in which the concentration of n-type carriers (i.e., electrons) is $1\times10^{20}$ cm$^{-3}$ or higher. The n-type metal oxide semiconductor material may include, for example, $SnO_2$, $In_2O_3$, ZnO, indium zinc oxide (IZO), indium tin oxide (ITO), indium gallium oxide (IGO), or a combination of two or more thereof. The second shared device layer 1800 may be formed using, for example, a chemical vapor deposition method, an atomic layer deposition method, a sputtering method, a laser deposition method, a solution coating method, and the like.

Subsequently, a second pillar electrode 1900 may be formed in the second hole pattern H2 in which the second shared device layer 1800 is formed. The second pillar electrode 1900 may be formed by filling the second hole pattern H2 with a conductive material. The conductive material may include, for example, a doped semiconductor material, metal, conductive metal nitride, conductive metal carbide, conductive metal silicide, conductive metal oxide, and a combination of two or more thereof. The second pillar electrode 1900 may be formed using, for example, a chemical vapor deposition, an atomic layer deposition method, a sputtering method, and the like. The semiconductor device according to an embodiment of the present disclosure may be manufactured through the above processes.

Figure 21:
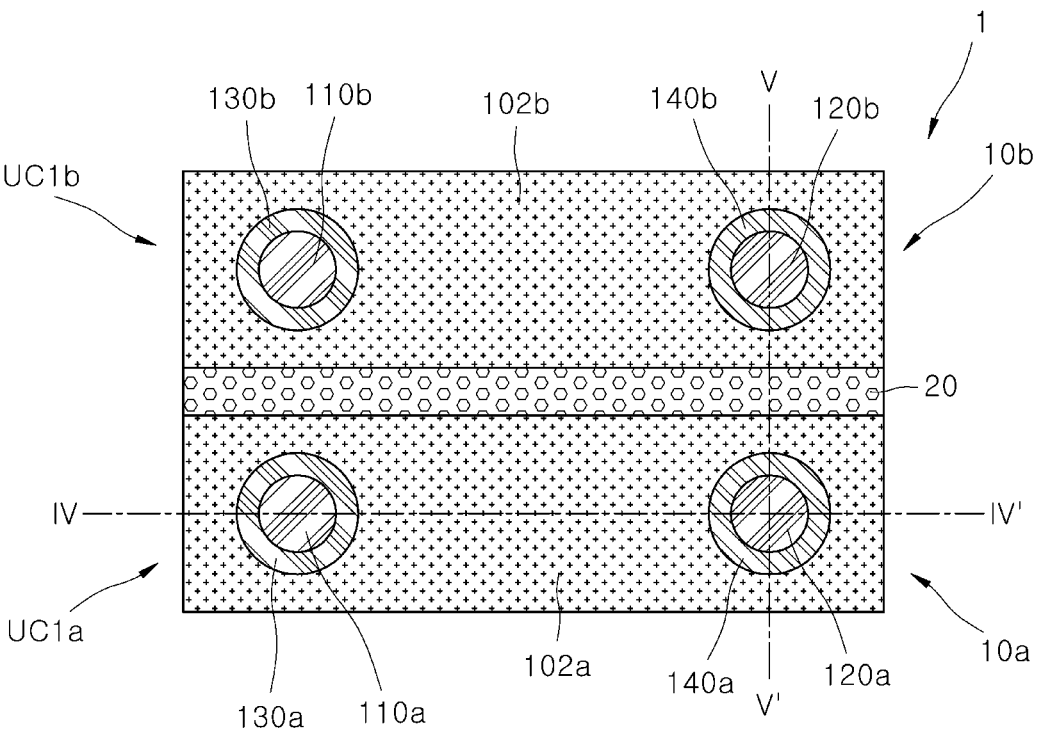
FIG. 21 is a schematic plan view illustrating a semiconductor device according to another embodiment of the present disclosure.
Figure 21:
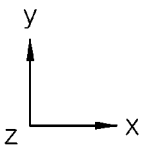
Figure 22:
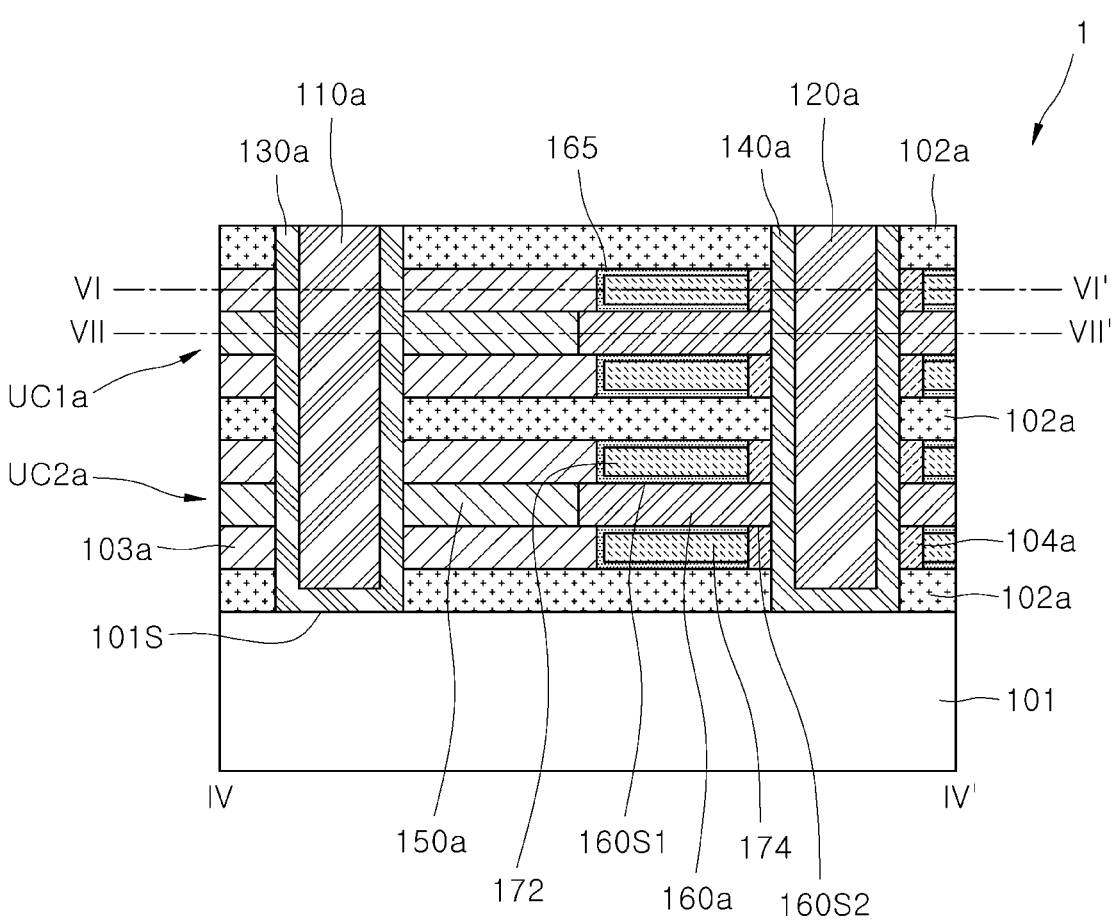
FIG. 22 is a cross-sectional view of a semiconductor device of FIG. 21 taken along a line IV-IV'.
Figure 22:
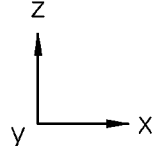
Figure 23:
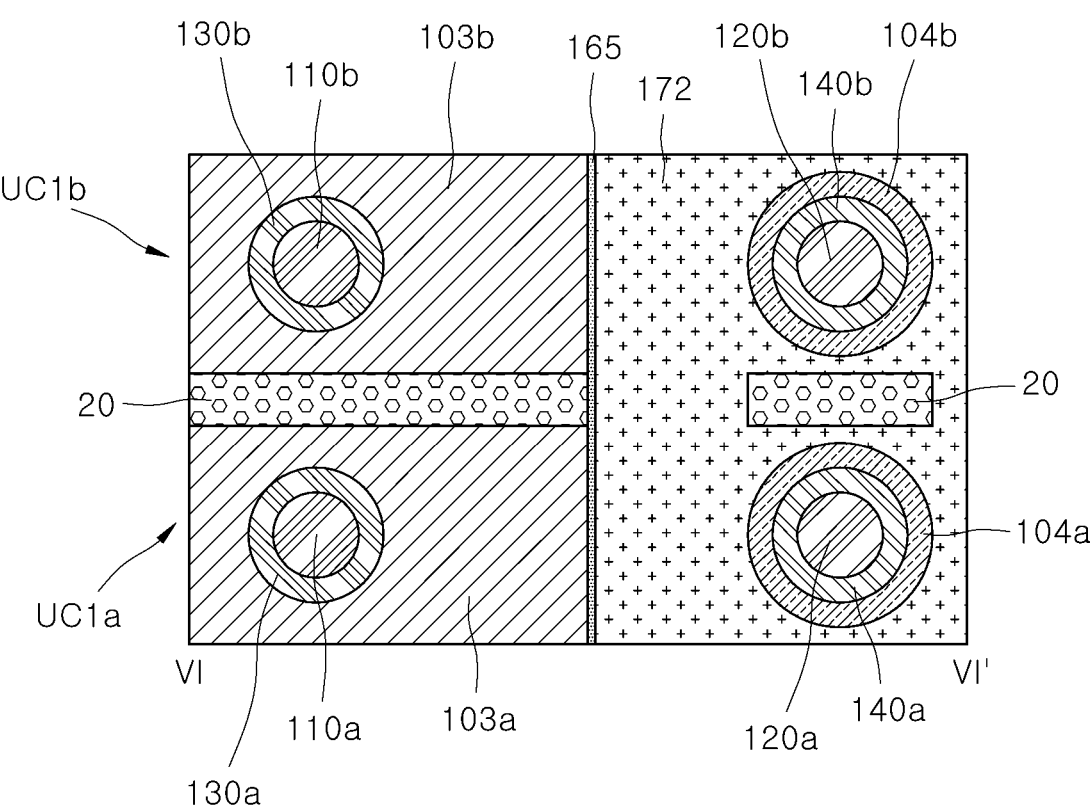
FIG. 23 is a cross-sectional view of a semiconductor device of FIG. 22 taken along a line VI-VI' and shown on an x-y plane.
Figure 23:
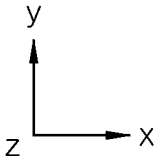
Figure 24:
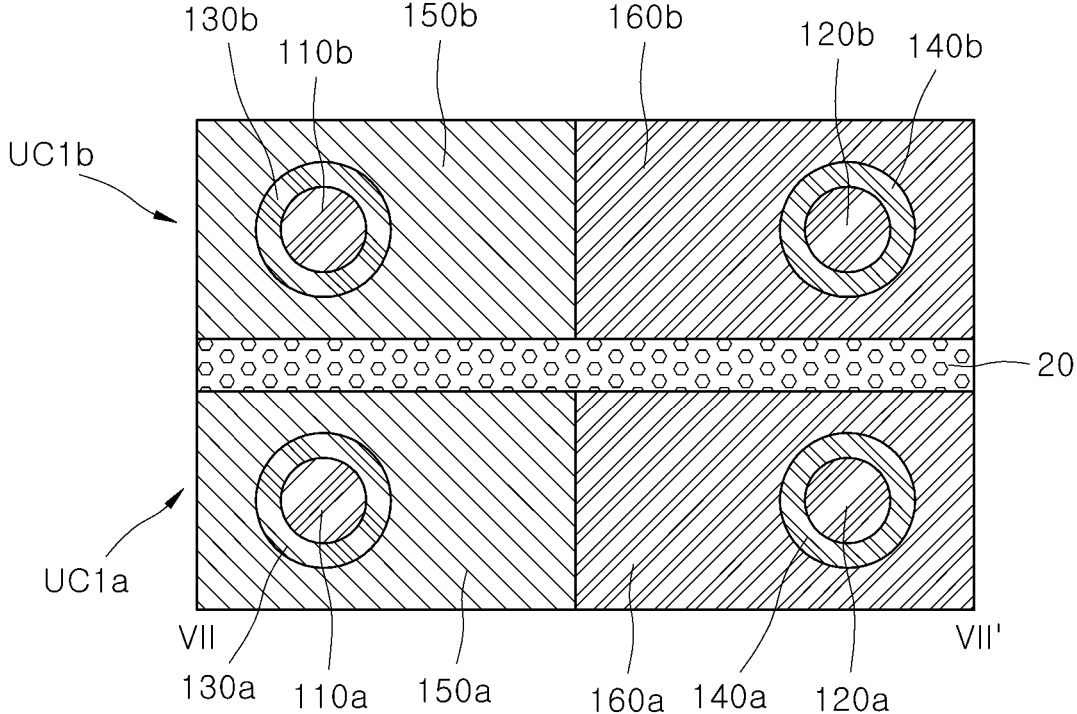
FIG. 24 is a cross-sectional view of a semiconductor device of FIG. 22 taken along a line VII-VII' and shown on an x-y plane.
Figure 24:
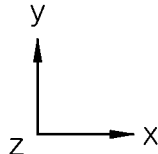
Figure 25:
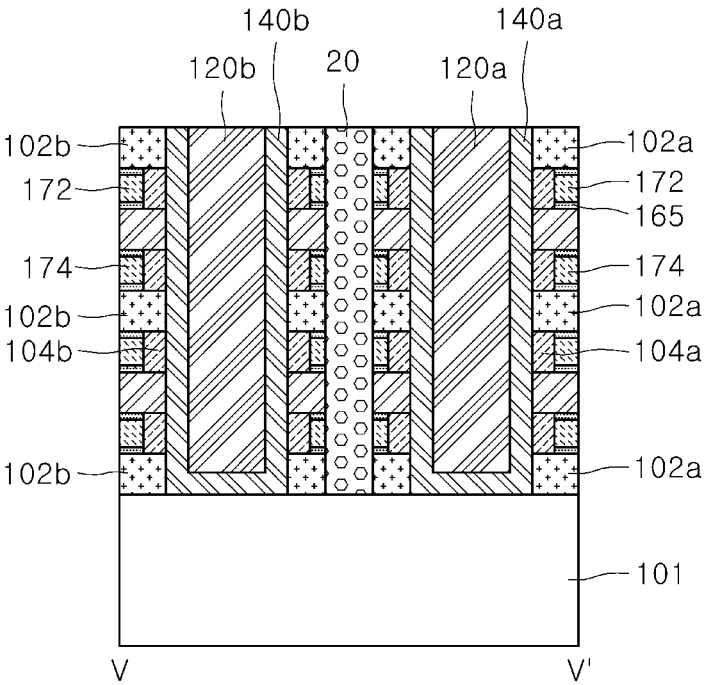
FIG. 25 is a cross-sectional view of a semiconductor device of FIG. 21 taken along a line V-V'.
Figure 25:
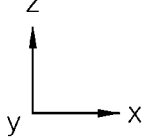

FIG. 21 is a schematic plan view illustrating a semiconductor device according to another embodiment of the present disclosure. FIG. 22 is a cross-sectional view of a semiconductor device of FIG. 21 taken along a line IV-IV'. FIG. 23 is a cross-sectional view of a semiconductor device of FIG. 22 taken along a line VI-VI' and shown on an x-y plane. FIG. 24 is a cross-sectional view of a semiconductor device of FIG. 22 taken along a line VII-VII' and shown on an x-y plane. FIG. 25 is a cross-sectional view of a semiconductor device of FIG. 21 taken along a line V-V'.

Referring to FIGS. 21 to 25, a semiconductor device 1 may include first and second memory cell groups 10a and 10b. The first and second memory cell groups 10a and 10b may be symmetrically disposed with respect to a cell isolation structure 20. The cell isolation structure 20 may isolate the first and second memory cell groups 10a and 10b from each other. The cell isolation structure 20 may be a wall structure disposed on a substrate 101. The cell isolation structure 20 may extend in a direction (i.e., the z-direction) that is substantially perpendicular to a surface 101S of the substrate 101 and a direction (e.g., the x-direction) that is substantially parallel to the surface 101S of the substrate 101.

Each of the first and second memory cell groups 10a and 10b may have substantially the same configuration as the semiconductor device 10 described above with reference to FIGS. 3 to 6. That is, first unit cell UC1a and second unit cell UC2a of the first memory cell group 10a may have substantially the same configurations as the first unit cell UC1 and the second unit cell UC2 of the semiconductor device 10 described above with reference to FIGS. 3 to 6, respectively. In addition, first unit cell UC1b and second unit cell UC2b of the second memory cell group 10b may have substantially the same configurations as the first unit cell UC1 and the second unit cell UC2 of the semiconductor device 10 described above with reference to FIGS. 3 to 6, respectively.

First pillar electrodes 110a and 110b, second pillar electrodes 120a and 120b, first shared device layers 130a and 130b, first base device layers 150a and 150b, second base device layers 160a and 160b, and second shared device layers 140a and 140b of the first and second memory cell groups 10a and 10b, respectively may be substantially the same as the first pillar electrode 110, the second pillar electrode 120, the first shared device layer 130, the first base device layer 150, the second base device layer 160b, and the second shared device layer 140 of the semiconductor device 10 of FIGS. 3 to 6. In addition, interlayer insulation layers 102a and 102b, first gate isolating insulation layers 103a and 103b, and second gate isolating insulation layers 104a and 104b of the first and second memory cell groups 10a and 10b, respectively may be substantially the same as the interlayer insulation layer 102, the first gate isolating insulation layer 103, and the second gate isolating insulation layer 104 of the semiconductor device 10 of FIGS. 3 to 6.

Referring to FIGS. 22 and 23, the first and second memory cell groups 10a and 10b may share gate dielectric layers 165 and control gate electrodes 170 each including an upper electrode part 172 and a lower electrode part 174 with each other. For example, the gate dielectric layers 165 and the control gate electrodes 170 may extend in the y-direction and may be commonly applied to the first and second memory cell groups 10a and 10b.

Figure 26:
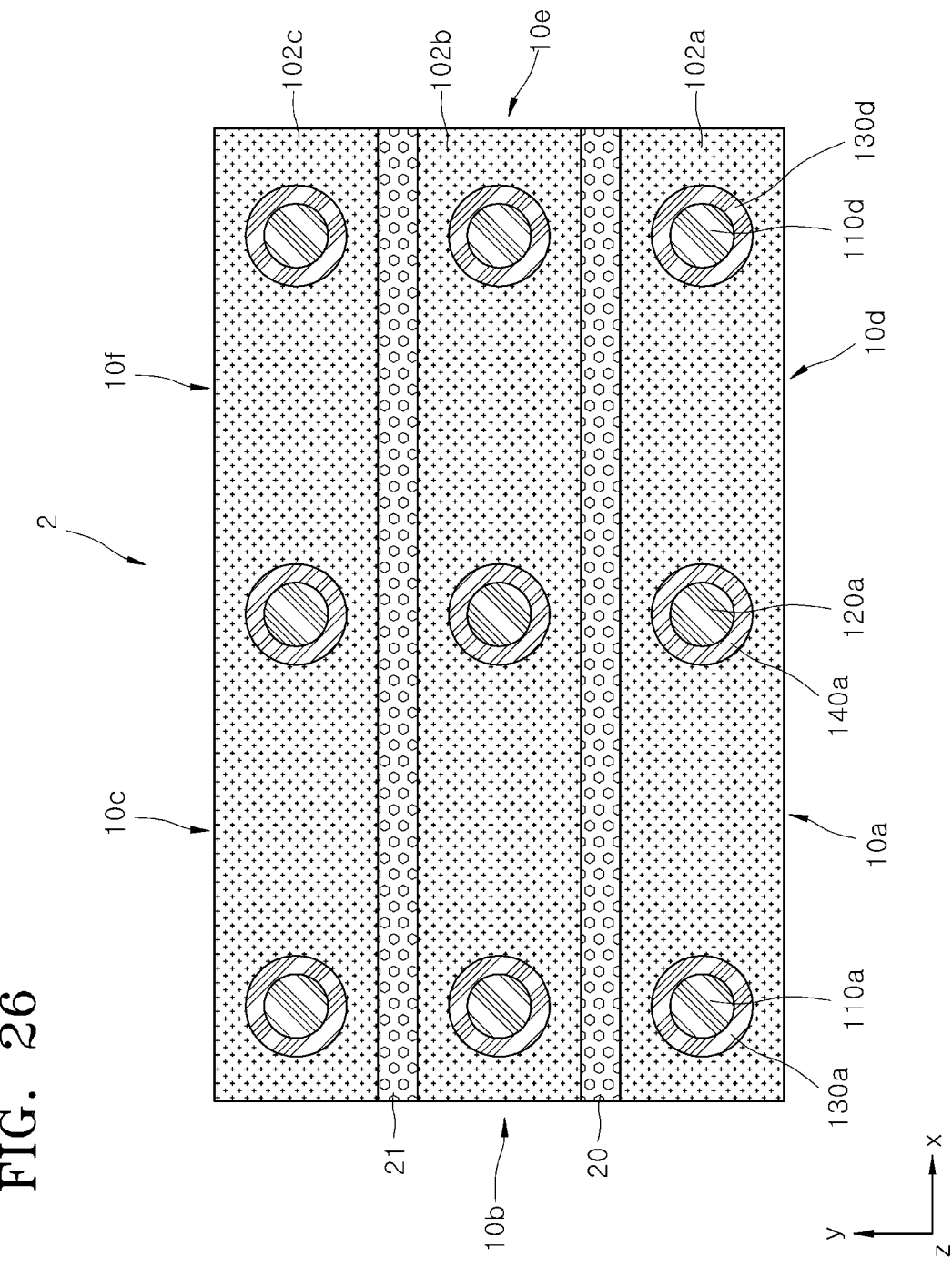
FIG. 26 is a schematic plan view illustrating a semiconductor device according to another embodiment of the present disclosure.

FIG. 26 is a schematic plan view illustrating a semiconductor device according to further another embodiment of the present disclosure. Referring to FIG. 26, a semiconductor device 2 may include first to sixth memory cell groups 10a, 10b, 10c, 10d, 10e, and 10f. The configuration of the first to sixth memory cell groups 10a, 10b, 10c, 10d, 10e, and 10f may be substantially the same as the configuration of a plurality of semiconductor devices 10 described above with reference to FIGS. 3 to 6.

The first and fourth memory cell groups 10a and 10d may be disposed symmetrically with the second and fifth memory cell groups 10b and 10e with respect to a first cell isolation structure 20. The first cell isolation structure 20 may isolate the first and fourth memory cell groups 10a and 10d and the second and fifth memory cell groups 10b and 10e from each other. The second and fifth memory cell groups 10b and 10e may be disposed symmetrically with the third and sixth memory cell groups 10c and 10f with respect to a second cell isolation structure 21. The second cell isolation structure 21 may isolate the second and fifth memory cell groups 10b and 10e and the third and sixth memory cell groups 10c and 10f from each other. In FIG. 26, interlayer insulation layers 102a, 102b, and 102c may be isolated from each other by the first and second cell isolation structures 20 and 21. The configuration of each of the first and second cell isolation structures 20 and 21 may be substantially the same as the configuration of the cell isolation structure 20 described with reference to FIG. 22.

Referring to FIG. 26, the first and fourth memory cell groups 10a and 10d may be disposed adjacent to each other in the x-direction. The first memory cell group 10a may include a first pillar electrode 110a, a first shared device layer 130a, a second shared device layer 140a, and a second pillar electrode 120a. The fourth memory cell group 10d may include a first pillar electrode 110d, a first shared device layer 130d, the second shared device layer 140a, and the second pillar electrode 120a. Accordingly, the first and second memory cell groups 10a and 10b may share the second shared device layer 140a and the second pillar electrode 120a.

In the same manner, the second and fifth memory cell groups 10b and 10e may be disposed adjacent to each other in the x-direction. In addition, the third and sixth memory cell groups 10c and 10f may be disposed adjacent to each other in the x-direction.

As the plurality of memory cell groups are arranged in the x-direction and the y-direction in the above-described manner, a semiconductor device according to an embodiment of the present disclosure may include memory cells including three-dimensionally integrated thyristors.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   a substrate;
   first and second pillar electrodes extending along a vertical direction substantially perpendicular to a surface of the substrate; and
   a plurality of memory cells disposed between the first and second pillar electrodes,
   wherein each of the plurality of memory cells includes:
   first and second shared device layers that are disposed adjacent to the first and second pillar electrodes, respectively, and extend along the vertical direction;
   first and second base device layers disposed between the first and second shared device layers, both first and second base device layers disposed on a plane over the substrate and substantially parallel to the surface of the substrate; and
   a control gate electrode disposed on one of the first and second base device layers.

2. The semiconductor device of claim 1, wherein the plurality of memory cells are disposed along the vertical direction.

3. The semiconductor device of claim 1, wherein the plurality of memory cells share the first and second shared device layers with each other.

4. The semiconductor device of claim 1,
   wherein the first shared device layer is disposed to surround the first pillar electrode, and
   wherein the second shared device layer is disposed to surround the second pillar electrode.

5. The semiconductor device of claim 1, wherein each of the plurality of memory cells includes an NPNP thyristor.

6. The semiconductor device of claim 1, wherein the control gate electrode extends in a direction substantially parallel to the surface of the substrate.

7. The semiconductor device of claim 1,
   wherein the first shared device layer contacts the first base device layer,
   wherein the second shared device layer contacts the second base device layer, and
   wherein the control gate electrode is disposed on the second base device layer.

8. The semiconductor device of claim 1,
   wherein each of the first shared device layer and the second base device layer includes a p-type metal oxide semiconductor material, and
   wherein each of the second shared device layer and the first base device layer includes an n-type metal oxide semiconductor material.

9. The semiconductor device of claim 8,
   wherein a concentration of a p-type carrier inside the first shared device layer is higher than a concentration of the p-type carrier inside the second base device layer, and

wherein a concentration of an n-type carrier inside the second shared device layer is higher than a concentration of the n-type carrier inside the first base device layer.

10. The semiconductor device of claim 8, wherein the p-type metal oxide semiconductor material includes at least one selected from the group consisting of SnO, CuO, $Cu_2O$, NiO, $CO_3O_4$, and $Cr_2O_3$.

11. The semiconductor device of claim 8, wherein the n-type metal oxide semiconductor material includes at least one selected from the group consisting of $SnO_2$, $In_2O_3$, ZnO, indium zinc oxide (IZO), indium tin oxide (ITO), and indium gallium oxide (IGO).

12. The semiconductor device of claim 1, wherein each of the first pillar electrode, the second pillar electrode, and the third control gate electrode includes at least one of a doped semiconductor material, metal, conductive metal nitride, conductive metal carbide, conductive metal silicide, and conductive metal oxide.

13. A semiconductor device comprising:

a substrate;

first and second pillar electrodes extending along a vertical direction substantially perpendicular to a surface of the substrate; and a plurality of memory cells disposed between the first and second pillar electrodes and disposed along the vertical direction, wherein each of the plurality of memory cells includes:

a first shared device layer including a p-type metal oxide semiconductor material and extending along the vertical direction;

a first base device layer, including an n-type metal oxide semiconductor material, that is disposed over the substrate to contact the first shared device layer on a plane substantially parallel to the surface of the substrate;

a second base device layer, including a p-type metal oxide semiconductor material, that is disposed to contact the first base device layer on the plane;

a second shared device layer, including an n-type metal oxide semiconductor material, that extends in the vertical direction and contacts the second base device layer; and a control gate electrode disposed on the second base device layer.

14. The semiconductor device of claim 13, wherein the first shared device layer is disposed to surround the first pillar electrode, and wherein the second shared device layer is disposed to surround the second pillar electrode.

15. The semiconductor device of claim 13, wherein the plurality of memory cells share the first and second shared device layers with each other.

16. The semiconductor device of claim 13, wherein the p-type metal oxide semiconductor material includes at least one selected from the group consisting of SnO, CuO, $Cu_2O$, NiO, $CO_3O_4$, and $Cr_2O_3$, and wherein the p-type metal oxide semiconductor material includes at least one selected from the group consisting of SnO, CuO, $Cu_2O$, NiO, $CO_3O_4$, and $Cr_2O_3$.

17. The semiconductor device of claim 13, wherein a concentration of a p-type carrier inside the first shared device layer is higher than a concentration of the p-type carrier inside the second base device layer, and wherein a concentration of an n-type carrier inside the second shared device layer is higher than a concentration of the n-type carrier inside the first base device layer.

* * * * *